(12) United States Patent
Houssameddine et al.

(10) Patent No.: US 11,605,409 B2
(45) Date of Patent: Mar. 14, 2023

(54) MTJ-BASED ANALOG MEMORY DEVICE

(71) Applicant: International Business Machines Corporation, Armonk, NY (US)

(72) Inventors: Dimitri Houssameddine, White Plains, NY (US); Julien Frougier, Albany, NY (US); Kangguo Cheng, Schenectady, NY (US); Ruilong Xie, Niskayuna, NY (US)

(73) Assignee: International Business Machines Corporation, Armonk, NY (US)

( * ) Notice: Subject to any disclaimer, the term of this patent is extended or adjusted under 35 U.S.C. 154(b) by 227 days.

(21) Appl. No.: 17/081,515

(22) Filed: Oct. 27, 2020

(65) Prior Publication Data
US 2022/0130441 A1  Apr. 28, 2022

(51) Int. Cl.
| | | |
|---|---|---|
| *G11C 11/16* | (2006.01) | |
| *H01L 27/22* | (2006.01) | |
| *H01L 43/02* | (2006.01) | |

(52) U.S. Cl.
CPC ........ *G11C 11/161* (2013.01); *G11C 11/1673* (2013.01); *G11C 11/1675* (2013.01); *H01L 27/228* (2013.01); *H01L 43/02* (2013.01)

(58) Field of Classification Search
None
See application file for complete search history.

(56) References Cited

U.S. PATENT DOCUMENTS

| | | | |
|---|---|---|---|
| 7,813,168 B2 * | 10/2010 | Zhu .................. | G11C 11/1675 365/158 |
| 2003/0058685 A1 | 3/2003 | Tran et al. | |
| 2004/0188734 A1 | 9/2004 | Tsang | |
| 2010/0097845 A1 * | 4/2010 | Sakimura ............ | H01L 43/08 365/158 |
| 2011/0298067 A1 | 12/2011 | Ishiwata et al. | |
| 2013/0182501 A1 * | 7/2013 | Sakimura ............ | G11C 11/1657 365/158 |
| 2013/0250665 A1 * | 9/2013 | Kitagawa ............ | H01L 27/228 365/158 |
| 2013/0320468 A1 | 12/2013 | Zhu et al. | |
| 2014/0010004 A1 | 1/2014 | Suzuki | |
| 2014/0254250 A1 * | 9/2014 | Mani .................. | H01L 43/12 365/158 |
| 2016/0308116 A1 | 10/2016 | Noh | |

(Continued)

OTHER PUBLICATIONS

Doevenspeck, J., et al., "SOT-MRAM based Analog in-Memory Computing for DNN inference", 2020 IEEE Symposium on VLSI Technology, IEEE, Jun. 16, 2020, 2 pages.

(Continued)

*Primary Examiner* — Tan T. Nguyen
(74) *Attorney, Agent, or Firm* — Scully, Scott, Murphy & Presser, P.C.; Daniel P. Morris, Esq.

(57) ABSTRACT

A magnetic domain device is provided in which a magnetic free layer (i.e., the storage layer) of a magnetic tunnel junction (MTJ) pillar is in close proximity to a conductive write line that is disposed beneath the MTJ pillar. The magnetic domain device further includes a pair of spaced apart bottom electrodes located beneath the conductive write line, and a top electrode located on the MTJ pillar. The magnetic domain device can be used in analog memories including multi-bit storage, analog memory for artificial intelligence (AI) applications.

14 Claims, 19 Drawing Sheets

(56) References Cited

U.S. PATENT DOCUMENTS

2018/0211994 A1 7/2018 Kim et al.
2018/0358105 A1 12/2018 Sasaki

OTHER PUBLICATIONS

International Search Report dated Feb. 3, 2022, received in a corresponding foreign application, 20 pages.
Sharma, N., et al., Magneto-Electric Magnetic Tunnel Junction Based Analog Circuit Options, 2017 30th IEEE International System-on-Chip Conference, Dec. 21, 2017, pp. 179-183.

* cited by examiner

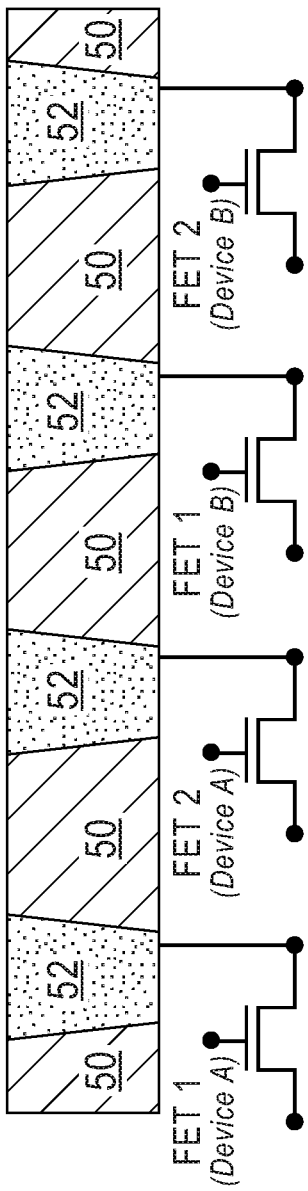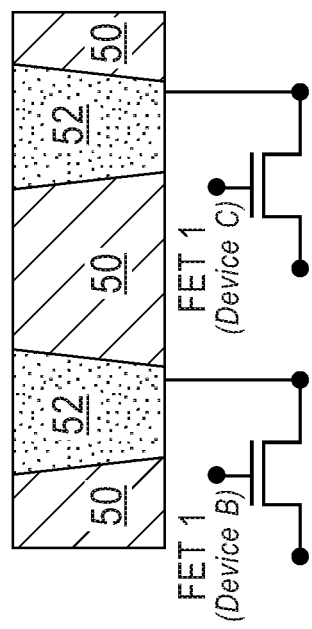
FIG. 6A
FIG. 6B
FIG. 6C

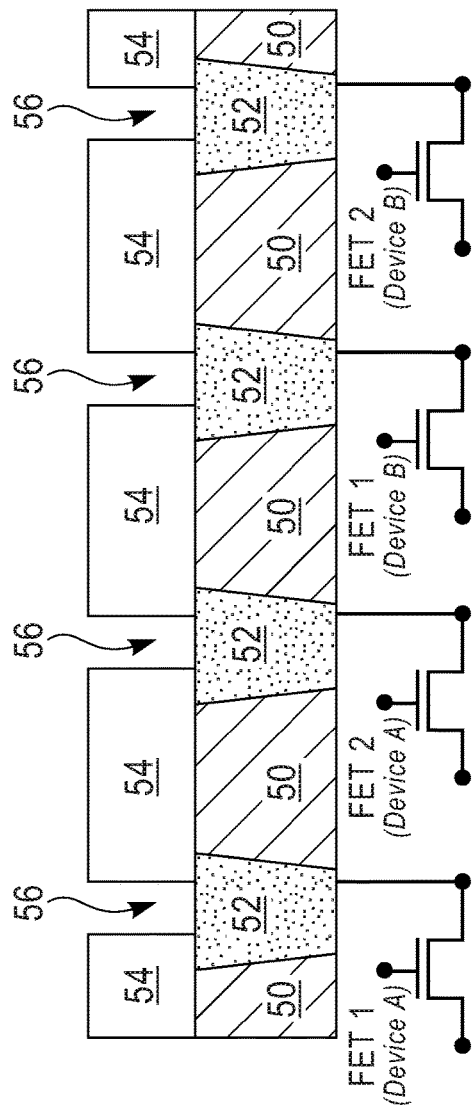
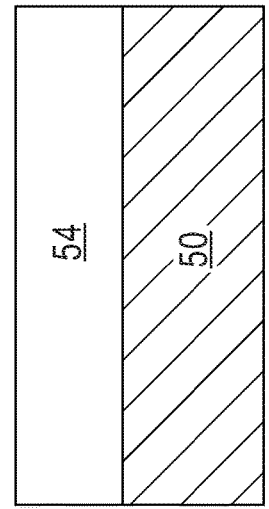
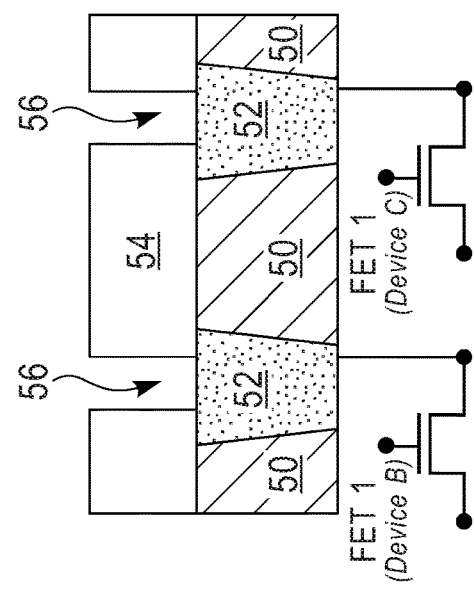
FIG. 7A
FIG. 7B
FIG. 7C

MTJ-BASED ANALOG MEMORY DEVICE

BACKGROUND

The present application relates to magnetic memory, and more particularly to a magnetic domain device including a magnetic tunnel junction (MTJ) pillar having a magnetic free layer in close proximity to a conductive write line.

As a next generation non-volatile memory substitute for flash memory, a resistance change memory for storing data by using a resistance variable element such as, for example, magnetoresistive random access memory (MRAM), resistance random access memory (ReRAM) and phase change random access memory (PCRAM), has attracted attention.

A magnetic wall driving type (or a magnetic wall shifting type) is one type of MRAM that has been recently developed. A magnetic wall driving type MRAM allows current to flow in an in-plane direction of the magnetic wall driving layer (i.e., the magnetic free layer), shifts the magnetic wall by a spin transfer effect of spin polarized electrons, and reverses the magnetization direction of the ferromagnetic film according to the direction of write current and write data.

Improved MRAM devices are currently being sought after which can be used in analog memories.

SUMMARY

A magnetic domain device is provided in which a magnetic free layer (i.e., the storage layer) of a magnetic tunnel junction (MTJ) pillar is in close proximity to a conductive write line that is disposed beneath the MTJ pillar. The magnetic domain device further includes a pair of spaced apart bottom electrodes located beneath the conductive write line, and a top electrode located on the MTJ pillar. The magnetic domain device can be used in analog memories including multi-bit storage, analog memory for artificial intelligence (AI) applications.

One aspect of the present application relates to a magnetic domain device. In one embodiment, the magnetic domain device includes a magnetic tunnel junction (MTJ) pillar located on a conductive write line.

In some embodiments, the MTJ pillar of the magnetic domain device is a top pinned MTJ pillar including, from bottom to top, a magnetic free layer, a tunnel barrier layer, and a magnetic reference layer. In such an embodiment in which a top pinned MTJ pillar is used, the magnetic free layer of the top pinned MTJ pillar can form a direct interface with the conductive write line. Also, and in such an embodiment in which a top pinned MTJ pillar is used, the magnetic free layer of the top pinned MTJ pillar can be spaced apart from the conductive write line by a thickness of one or more material layers. In some embodiments, the one or more material layers include a current confinement layer, a conductive via structure, or a combination of a current confinement layer and a conductive via structure.

In some embodiments, the MTJ pillar of the magnetic domain device is a bottom pinned MTJ pillar including, from bottom to top, a magnetic reference layer, a tunnel barrier layer, and a magnetic free layer. In such an embodiment in which a bottom pinned MTJ pillar is used, the magnetic free layer of the bottom pinned MTJ pillar is spaced apart from the conductive write line by a combined thickness of at least the magnetic reference layer and the tunnel barrier layer. In some cases, the combined thickness can further include a thickness of one or more material layers. In some embodiments, the one or more material layers include a current confinement layer, a conductive via structure, or a combination of a current confinement layer and a conductive via structure.

The magnetic domain device can further include a pair of spaced apart bottom electrodes located beneath, and in contact with, the conductive write line. Each bottom electrode of the pair of spaced apart bottom electrodes is located on a surface of a first electrically conductive structure. Each first electrically conductive structure is connected to an access device such as a field effect transistor.

The magnetic domain device can further include a top electrode which is located on the MTJ pillar. In some embodiments, the top electrode has an outermost sidewall that is vertically aligned to an outermost sidewall of each of the MTJ pillar, and the conductive write layer. A dielectric liner can be located on a topmost surface of top electrode, and along an outermost sidewall of each of the top electrode, the MTJ pillar, and the conductive write layer. An electrically conductive structure can be present that contacts a portion of the topmost surface of the top electrode.

In another aspect of the present application, a method of programming (i.e., write operation) the inventive magnetic domain device disclosed above is provided. In one embodiment, the method includes providing a magnetic domain device including a magnetic tunnel junction (MTJ) pillar located on a conductive write line, and thereafter passing a current through the conductive write line, wherein the current in the conductive write line generates a magnetic field that nucleates magnetic domains in a magnetic free layer of the MTJ pillar.

In some embodiments of programming, the MTJ pillar further includes, in addition to the magnetic free layer, a tunnel barrier layer, and a magnetic reference layer, and the conductive write line is spaced apart from the magnetic free layer by a distance of from 1 nm to 100 nm. In some embodiments, the magnetic field generated by the current has a magnitude of I/d wherein I is the intensity of the current in the conductive write line, and d is the distance in which the conductive write line is spaced apart from the magnetic free layer.

In another aspect of the present application, a method of reading a resistance state of the inventive magnetic domain device disclosed above is provided. In one embodiment, the method includes providing a magnetic domain device comprising a magnetic tunnel junction (MTJ) pillar located on a conductive write line, wherein a pair of spaced apart bottom electrodes is located beneath the conductive write line and a top electrode is located on the MTJ pillar. Next, a read voltage is applied to at least one of the bottom electrodes and the top electrode, and thereafter the device resistance provided by the read voltage is measured. In the present application, the device resistance is proportional to the area of magnetic domains aligned along/against the magnetization of a magnetic reference layer of the MTJ pillar. In some embodiments, the voltage can be applied between the pair of bottom electrodes and the top electrode.

BRIEF DESCRIPTION OF THE DRAWINGS

FIG. 6A is a cross sectional view of an initial structure along X-X shown in FIG. 5 that can be used in forming a magnetic domain device in accordance with an embodiment of the present application; the initial structure is a back-end-of-the-line (BEOL) structure including a plurality of first electrically conductive structures embedded in a first interlayer dielectric (ILD) material.

FIG. 6B is a cross sectional view of the initial structure shown in FIG. 6A, but along $Y_1$-$Y_1$ shown in FIG. 5.

FIG. 6C is a cross sectional view of the initial structure shown in FIG. 6A, but along $Y_2$-$Y_2$ shown in FIG. 5.

FIG. 7A is a cross sectional view of the initial structure shown in FIG. 6A (and along X-X shown in FIG. 5) after forming a second ILD material containing a plurality of openings on the lower interconnect level, wherein each opening physically exposes a surface of one of the underlying first electrically conductive structures present in the first ILD material.

FIG. 7B is a cross sectional view of the structure shown in FIG. 7A, but along $Y_1$-$Y_1$ shown in FIG. 5.

FIG. 7C is a cross sectional view of the structure shown in FIG. 7A, but along $Y_2$-$Y_2$ shown in FIG. 5.

DETAILED DESCRIPTION

Figure 1:
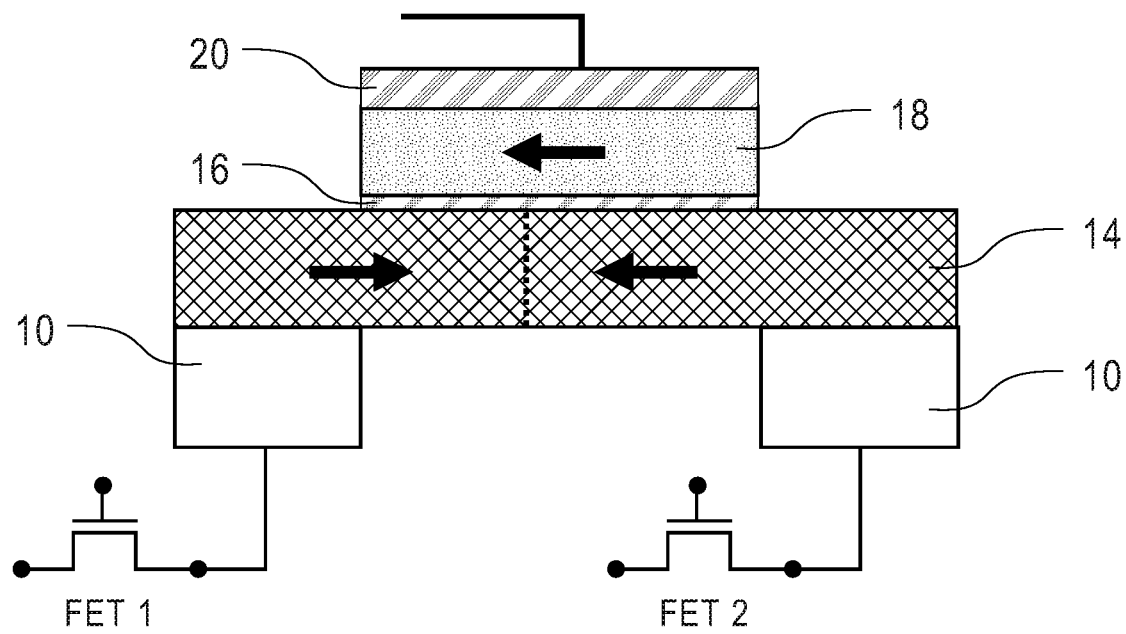
FIG. 1 is a cross sectional view of a prior art magnetic domain wall based device.

The present application will now be described in greater detail by referring to the following discussion and drawings that accompany the present application. It is noted that the drawings of the present application are provided for illustrative purposes only and, as such, the drawings are not drawn to scale. It is also noted that like and corresponding elements are referred to by like reference numerals.

In the following description, numerous specific details are set forth, such as particular structures, components, materials, dimensions, processing steps and techniques, in order to provide an understanding of the various embodiments of the present application. However, it will be appreciated by one of ordinary skill in the art that the various embodiments of the present application may be practiced without these specific details. In other instances, well-known structures or processing steps have not been described in detail in order to avoid obscuring the present application.

It will be understood that when an element as a layer, region or substrate is referred to as being "on" or "over" another element, it can be directly on the other element or intervening elements may also be present. In contrast, when an element is referred to as being "directly on" or "directly over" another element, there are no intervening elements present. It will also be understood that when an element is referred to as being "beneath" or "under" another element, it can be directly beneath or under the other element, or intervening elements may be present. In contrast, when an element is referred to as being "directly beneath" or "directly under" another element, there are no intervening elements present.

Referring first to FIG. 1, there is illustrated a prior art magnetic domain wall based device. The prior art magnetic domain wall based device illustrated in FIG. 1 includes a pair of bottom electrodes 10. Each bottom electrode 10 is connected to an access device such as, for example, a field effect transistor (FET), i.e., FET1 and FET2. A magnetic free layer 14 (which serves as a storage layer) is located above the bottom electrode 10. Atop the magnetic free layer 14 is a tunnel barrier layer 16, a magnetic reference layer 18 and a top electrode 20. In the prior art magnetic domain wall based device illustrated in FIG. 1, writing is performed by spin-torque induced domain wall motion, and reading is performed by tunnel magnetoresistance (TMR) measurements.

Figure 2A:
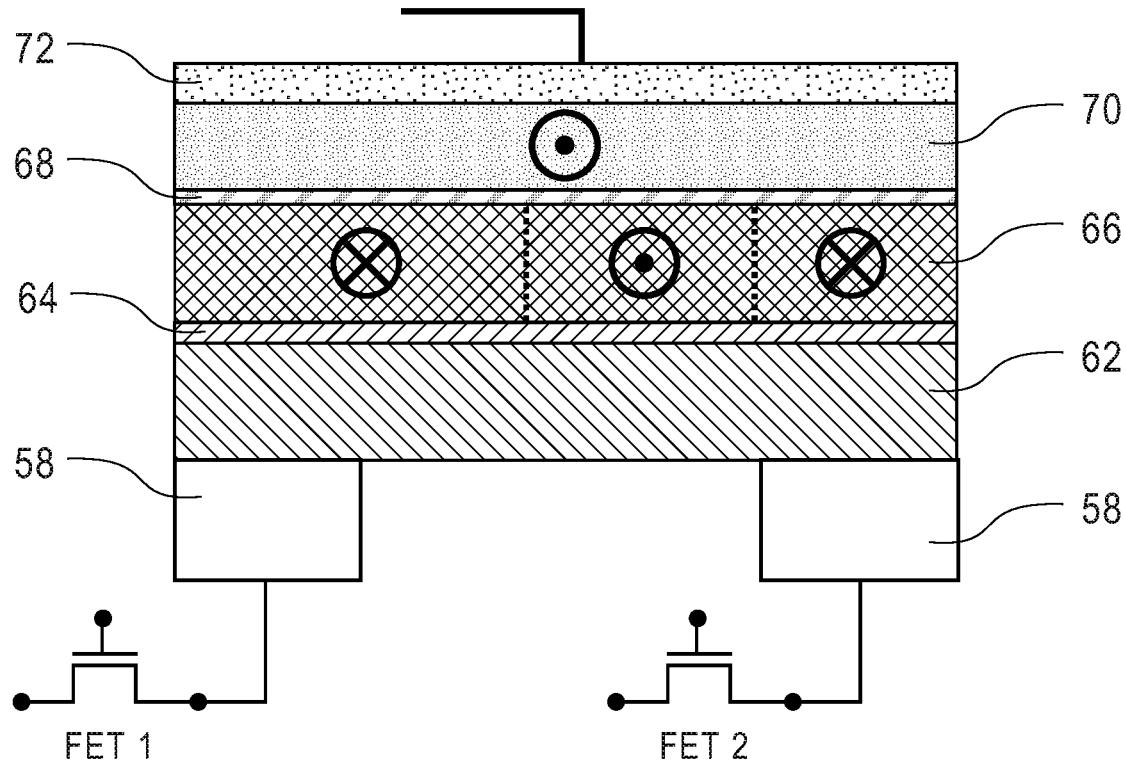
FIGS. 2A-2D are cross sectional views of magnetic domain devices in accordance with various embodiments of the present application.

Referring now to FIG. 2A, there is illustrated a magnetic domain device in accordance with an embodiment of the present application. The magnetic domain device illustrated in FIG. 2 also includes a pair of bottom electrodes 58. Each bottom electrode 58 is connected to an access device such as, for example, a field effect transistor (FET), i.e., FET1 and FET2. In the inventive magnetic domain device illustrated in FIG. 2A, a MTJ-containing structure including a conductive write line 62, a current confinement layer 64, a magnetic free layer 66, a tunnel barrier layer 68, a magnetic reference layer 70, and a top electrode 72 is located above the pair of bottom electrodes 58. In the present application, the magnetic free layer 66, the tunnel barrier layer 68, and the magnetic reference layer 70 provide a MTJ pillar (i.e., a memory element). In some embodiments, the current confinement layer 64 is not present and the MTJ pillar can form a direct interface with the conductive write line 62. The current confinement layer 64, if present, has a higher resistivity than the conductive write line 62, allowing the write current to primarily flow in the conductive write line 62.

In the present application, the magnetic free layer 66 of the MTJ pillar (66/68/70) is in close proximity to the conductive write line 62. By "close proximity" it is meant that the magnetic free layer 66 of the MTJ pillar (66/68/70) is either in direct physical contact with the conductive write line 62, or the magnetic free layer 66 of the MTJ pillar (66/68/70) is separated from the conductive write line 62 by a distance of from 1 nm to 100 nm. Stated in other terms, the term "close proximity" denotes that the magnetic free layer 66 of the MTJ pillar is located a distance of 100 nm or less from the conductive write line 62. In the illustrated embodiment, the magnetic free layer 66 of the MTJ pillar (66/68/70) is separated from the conductive write line 62 by a distance represented by the thickness of the current confinement layer 64. In other embodiments and when the MTJ pillar has a configuration in which the magnetic free layer 66 is located above both the magnetic reference layer 70, and the tunnel barrier layer 68, the magnetic free layer 66 of the MTJ pillar (66/68/70) is separated from the conductive write line 62 by a distance represented by a combined thickness of the current confinement layer 64, the magnetic reference layer 70, and the tunnel barrier layer 68. When present, the current confinement layer 64 has a resistance-area product significantly lower (by a factor of 10) than that of the tunnel barrier layer 68 so the series resistance introduced by the current confinement layer 64 will not significantly reduce the magnetoresistance of the MTJ-containing device.

Figure 2B:
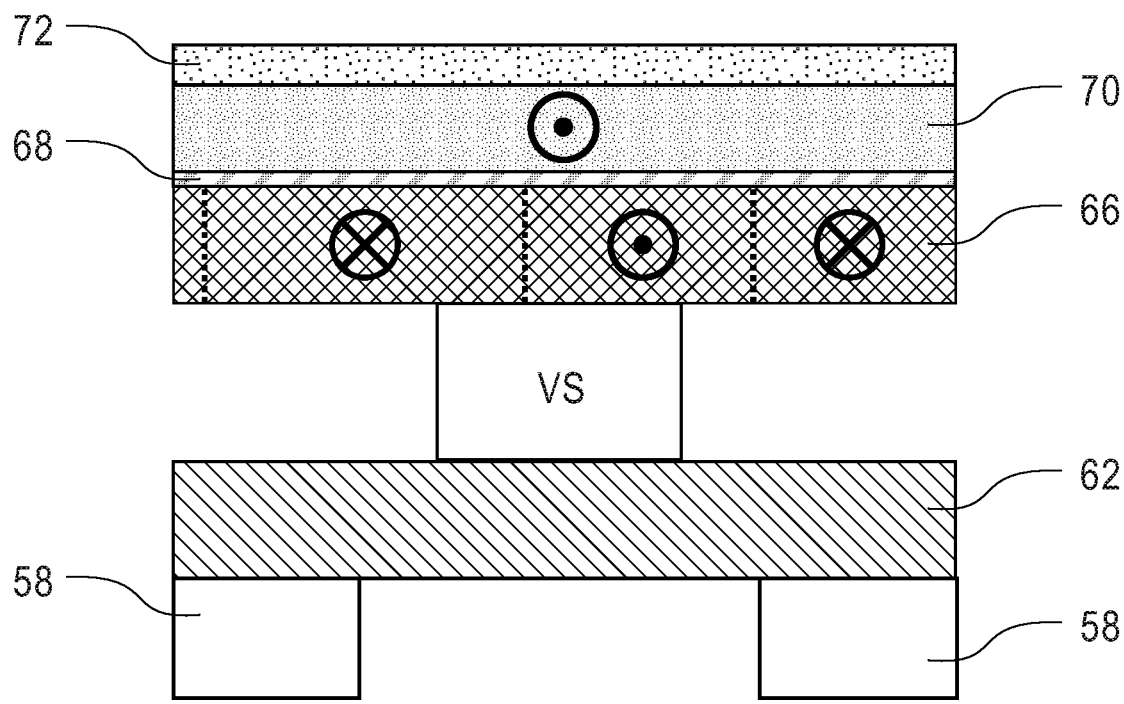
Figure 2C:
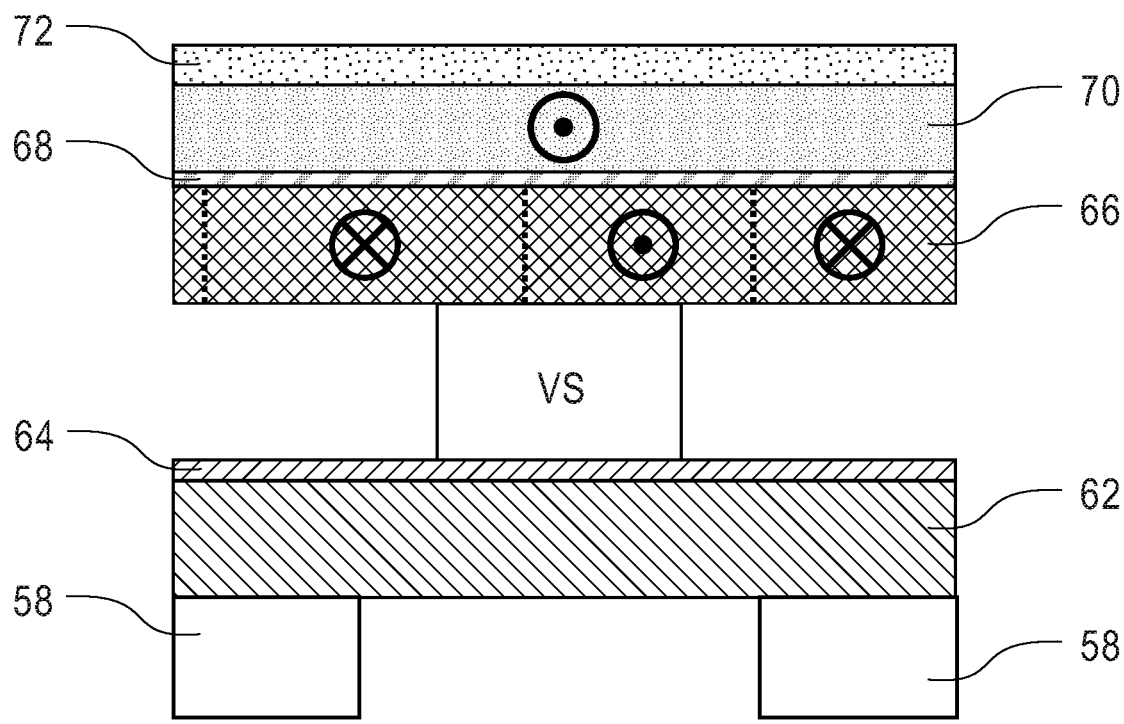
Figure 2D:
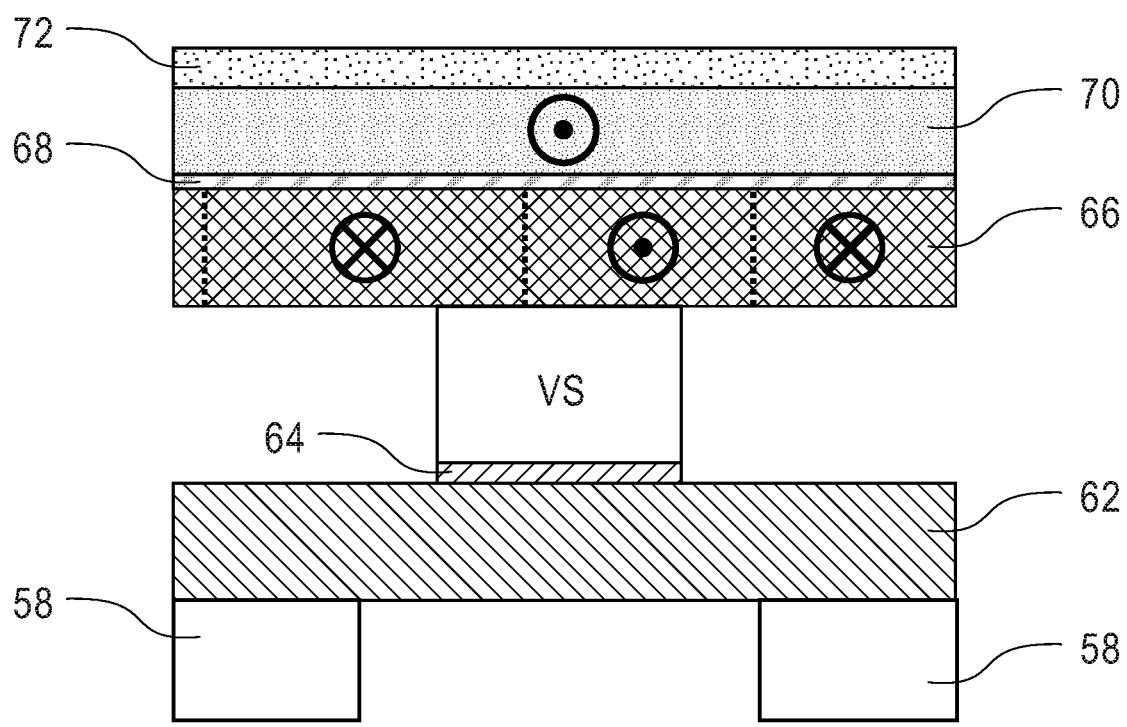

Referring now to FIGS. 2B-2D, there are illustrated other magnetic domain devices in accordance with other embodiments of the present application. Notably, FIG. 2B illustrates a magnetic domain device similar to the device shown in FIG. 2A except that the current confinement layer 64 has been replaced by a conductive via structure, VS, (the conductive via structure, VS, can include one of the conductive materials mentioned herein below for the first electrically conductive structures 52). The access devices, i.e., FET1 and FET2 are not shown for clarity in FIG. 2B. In FIG. 2B, the magnetic free layer 66 is spaced apart from the conductive write line 62 by a thickness of the conductive via structure, VS.

FIG. 2C illustrates a magnetic domain device similar to the device shown in FIG. 2A except that a conductive via structure, VS, is used in conjunction with the current confinement layer 64 such that the magnetic free layer 66 is spaced apart from the conductive write line 62 by a combined thickness of the current confinement layer 64 and the conductive via structure, VS. The access devices, i.e., FET1 and FET2 are not shown for clarity in FIG. 2C.

FIG. 2D illustrates a magnetic domain device similar to the device shown in FIG. 2A except that a conductive via structure, VS, is used in conjunction with a patterned current confinement layer 64 such that the magnetic free layer 66 is spaced apart from the conductive write line 62 by a combined thickness of the patterned current confinement layer 64 and the conductive via structure, VS. The access devices, i.e., FET1 and FET2 are not shown for clarity in FIG. 2D.

It emphasized that in any of the illustrated embodiments shown in FIGS. 2A-2D, the magnetic free layer 66 and the magnetic reference layer 70 can switch locations such that the magnetic reference layer 70 is located beneath the tunnel barrier layer 68, and the magnetic free layer 66 is located above the tunnel barrier layer 68.

Figure 3A:
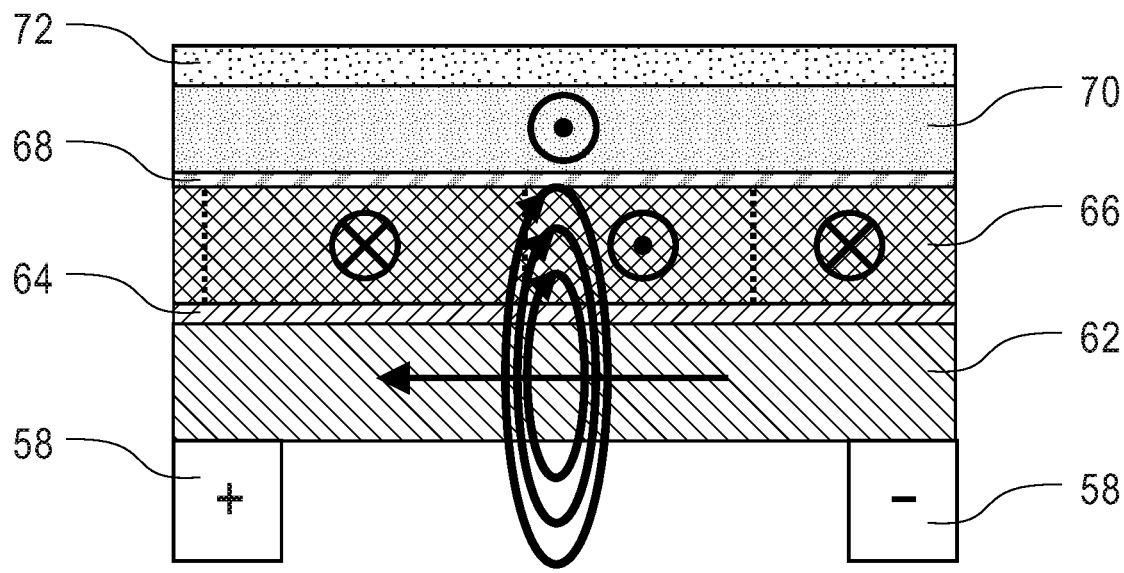
FIG. 3A shows the magnetic domain device of FIG. 2A during device write operation.
Figure 4:
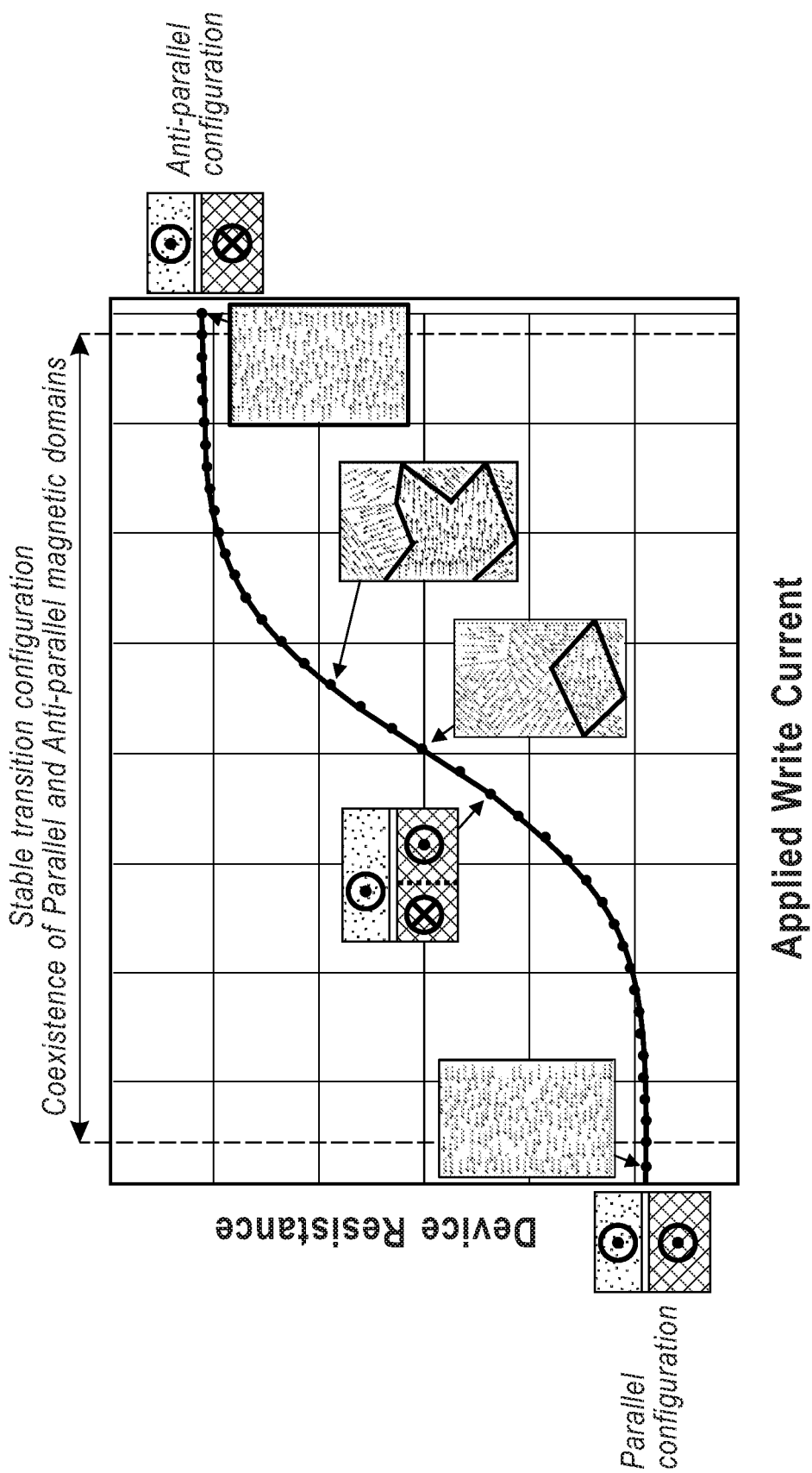
FIG. 4 is a graph of device resistance vs. applied write current illustrating the write operation for the magnetic domain device illustrated in FIG. 2A.

Referring now to FIG. 3A, there is shown the magnetic domain device of FIG. 2A during device write (i.e., programming) operation. The device write operation includes passing a current in the conductive write line 62 (the arrow in FIG. 2 shows the direction of this current). This current generates a magnetic field (shown by the circles in FIG. 2A) that nucleates domains in the magnetic free layer 66 (i.e., the storage layer). The magnetic reference layer 70 has a high coercivity to prevent domains from forming therein. The intensity and direction of the magnetic field determine the relative area of each domain orientation. The magnitude of the magnetic field that is generated in this example can be approximately I/d wherein I is the intensity of the current in the conductive write line 62 and d is the distance from the magnetic free layer 66 (i.e., the storage layer). FIG. 4 is a graph showing the device resistance vs. applied write current for the write operation described above. At a large positive/negative current, the magnetic free layer 66 (i.e., the storage layer) magnetization is fully saturated anti-parallel/parallel to the magnetic reference layer 70 and defines the maximum/minimum resistance levels of the device. The device will be operated in the non-saturated region where multiple domains with different magnetization directions coexist. The device can be initialized in a state where roughly 50% of the area will have a magnetization component aligned along the magnetization of the magnetic reference layer and 50% of the area will have a magnetization component aligned against the magnetization of the magnetic reference layer. Such an initialization process, also called demagnetization process, can be performed by applying alternative positive and negative fields of decreasing amplitude. This initial state is represented FIG. 4 for zero-applied current and has a resistance mid-way between the high resistance and low resistance states. Further applying a positive/negative current will increase the area with domains aligned against/along the magnetization direction of the magnetic reference layer and will gradually increase/decrease the resistance of the device.

Figure 3B:
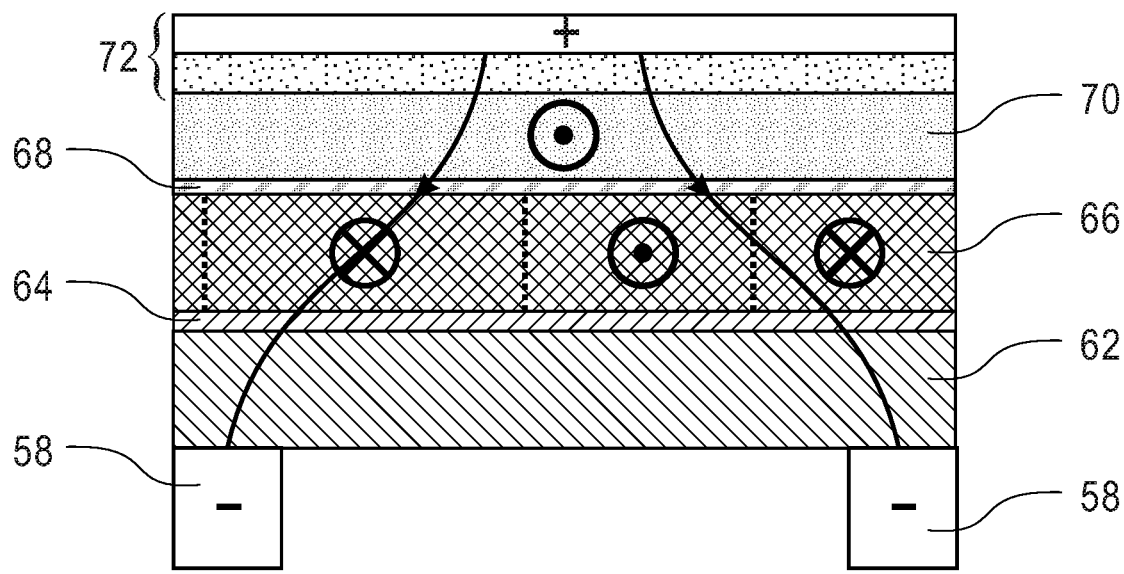
FIG. 3B shows the magnetic domain device of FIG. 2A during device read operation.

Referring now to FIG. 3B, there is shown the magnetic domain device of FIG. 2A during a device read operation. The device read operation includes applying a read voltage between the bottom electrodes 58 and top electrode 72, and then measuring the device resistance provided by the applied read voltage. Measuring can be performed by sensing the current flowing through the device using a sense-amplifier read circuit. The device resistance is proportional to the area of magnetic domains aligned along/against the magnetization of the magnetic reference layer 70.

Figure 5:
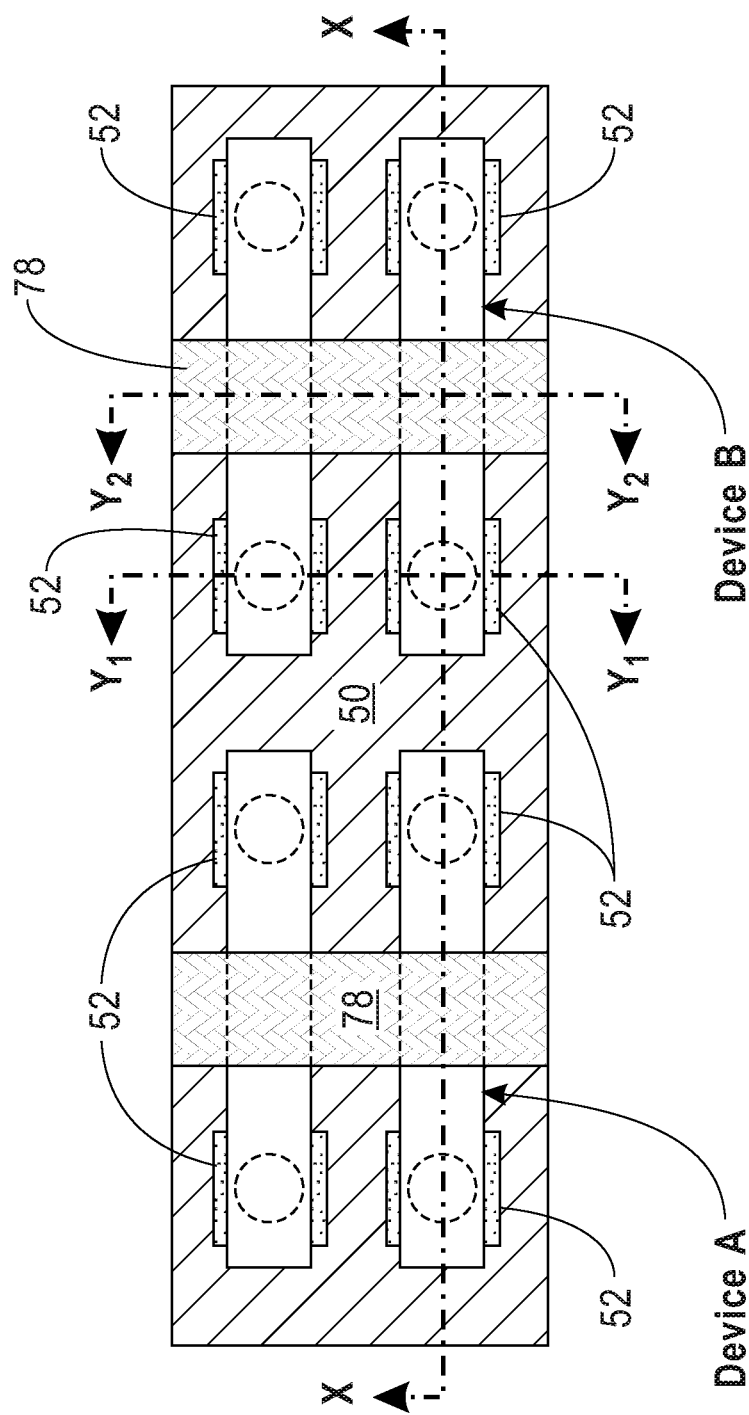
FIG. 5 is a top-down view showing various cross-sectional views for a structure including four magnetic domain devices, two of which are labeled as Device A and Device B, in accordance with an embodiment of the present application.

A method of forming a structure including the magnetic domain device of the present application will now be described detail by referring to FIGS. 6A-13C. However, and in order to best understand those drawings, reference is first made to FIG. 5 which is a top-down view showing various cross-sectional views for a structure including four magnetic domain devices, two of which are labeled as Device A and Device B, in accordance with an embodiment of the present application; X-X is cross sectional view along an axis including both Device A and Device B, $Y_1$-$Y_1$ is cross sectional view perpendicular to X-X and through Device B and Device C (not labeled in FIG. 5, but labeled in the $Y_1$-$Y_1$ cross sectional views, e.g., see, FIGS. 6B, 7B, etc.), and $Y_2$-$Y_2$ is cross sectional view perpendicular to X-X and between two adjacent Device Bs and two adjacent Device Cs.

Referring now to FIGS. 6A-6C, there are shown various cross sectional views of an initial structure (50/52) that can be used in forming a magnetic domain device in accordance with an embodiment of the present application. The initial structure that can be employed is a back-end-of-the-line (BEOL) structure (52/50) including a plurality of first electrically conductive structures 52 embedded in a first interlayer dielectric (ILD) material 50. Each first electrically conductive structure 52 typically has a topmost surface that is coplanar with a topmost surface of the first ILD material 50.

It is noted that the BEOL structure illustrated in FIGS. 6A-6C is located above a front-end-of-the-line (FEOL) level (not specifically shown) that contains one or more access devices such as, for example, one or more transistors. In FIGS. 6A-6C, FET 1 and FET 2 of Device A and FET 1 and FET 2 of Device B are shown by way of one example of transistors that can be present in the FEOL. In some embodiments, the BEOL structure illustrated in FIGS. 6A-6C is a middle-of-the-line (MOL) level. In other embodiments, the BEOL structure illustrated in FIGS. 6A-6C is an interconnect level of a multi-layered BEOL interconnect structure.

The first ILD material 50 can be composed of any dielectric material including, for example, silicon dioxide, silsesquioxanes, C doped oxides (i.e., organosilicates) that includes atoms of Si, C, O and H, thermosetting polyarylene ethers, or multilayers thereof. The term "polyarylene" is used in this application to denote aryl moieties or inertly substituted aryl moieties which are linked together by bonds, fused rings, or inert linking groups such as, for example, oxygen, sulfur, sulfone, sulfoxide, carbonyl and the like.

The first ILD material 50 can have a dielectric constant (all dielectric constants mentioned herein are measured relative to a vacuum, unless otherwise stated) that is 4.0 or less. In one embodiment, the first ILD material 50 has a dielectric constant of 2.8 or less (i.e., an ultra-low-k (ULK) dielectric material is used). These ULK dielectric materials generally have a lower parasitic cross talk as compared to dielectric materials whose dielectric constant is greater than 4.0. Examples of ULK dielectric materials that can be employed as the first ILD material 50 include, but are not limited to, OMCTS (octamethylcyclotetrasiloxane) and SiNCH.

The first ILD material 50 can be formed by a deposition process such as, for example, chemical vapor deposition (CVD), plasma enhanced chemical vapor deposition (PECVD) or spin-on coating. The dielectric material layer 10 can have a thickness from 50 nm to 250 nm. Other thicknesses that are lesser than 50 nm, and greater than 250 nm can also be employed in the present application.

Each first electrically conductive structure 52 that is present in the first ILD material 50 is composed of an electrically conductive metal or electrically conductive metal alloy. Examples of electrically conductive metals that can be used in the present application include copper (Cu), aluminum (Al), or tungsten (W), while an example of an electrically conductive metal alloy is a Cu—Al alloy. The electrically conductive metal or electrically conducive metal alloy layer can be formed utilizing a deposition process such as, for example, CVD, PECVD, sputtering, chemical solution deposition or plating. In one embodiment, a bottom-up plating process is employed in forming the electrically conductive metal or electrically conductive metal alloy layer.

In some embodiments, a diffusion barrier liner is formed along the sidewalls and a bottom wall of each of first electrically conductive structures 52. In some embodiments, no diffusion barrier liner is present. The diffusion barrier liner is composed of a diffusion barrier material (i.e., a material that serves as a barrier to prevent a conductive material such as copper from diffusing there through). Examples of diffusion barrier materials that can be used in providing the diffusion barrier liner include, but are not limited to, Ta, TaN, Ti, TiN, Ru, RuN, RuTa, RuTaN, W, or WN. In some embodiments, the diffusion barrier material may include a material stack of diffusion barrier materials. In one example, the diffusion barrier material may be composed of a stack of Ta/TaN. The diffusion barrier material layer can be formed by a deposition process including, for example, CVD, PECVD, atomic layer deposition (ALD), physical vapor deposition (PVD), sputtering, chemical solution deposition or plating.

The structure including the first ILD material 50, the first electrically conductive structures 52, and, if present, the diffusion barrier liner may be formed utilizing conventional processes that are well-known to those skilled in the art including, for example, a damascene process. A damascene process includes forming, by lithographic patterning, openings into the first ILD material 50, forming, and if present, a diffusion barrier material in the openings and on the first ILD material 50, and filling each opening with an electrically conductive material as defined above. A planarization process such as, for example, chemical mechanical polishing (CMP) can be used to remove any material (including diffusion barrier material and electrically conductive material) that is present outside the openings and on the first ILD material 50.

Referring now to FIGS. 7A-7C, there are shown various cross sectional views of the initial structure shown in FIGS. 6A-6C after forming a second ILD material 54 containing a plurality of openings 56 on the lower interconnect level (50/52), wherein each opening 56 physically exposes a surface of one of the underlying first electrically conductive structures 52 present in the first ILD material 50.

The second ILD material 54 can include one of the dielectric materials mentioned above for the first ILD material 50. In some embodiments of the present application, the second ILD material 54 is composed of a dielectric material that is compositionally the same as the dielectric material that provides the first ILD material 50. In yet other embodiments, the second ILD material 54 is composed of a dielectric material that is compositionally different than the dielectric material that provides the first ILD material 50. The second ILD material 54 can be formed utilizing one of the deposition processes mentioned above in forming the first ILD material 50.

Each of the openings 56 that are formed into the second ILD material can be formed by lithography and etching. Each opening 56 that is formed into the second ILD material 54 has a critical dimension (CD) that is typically less than a CD of the underlying first electrically conductive structures 52.

In some embodiments (not shown), a dielectric capping layer can be formed on the lower interconnect level (50/52) prior to forming the second ILD material 54. When employed, the dielectric capping layer is composed of a dielectric material that is typically, but not necessarily always, compositionally different from the dielectric material that provides the first ILD material 50 and/or the second ILD material 54. Illustrative examples of dielectric materials that can be used as the dielectric capping layer include, but are not limited to, SiN, SiC, Si₃N₄, SiO₂, AlO$_x$, a carbon doped oxide, a nitrogen and hydrogen doped silicon carbide SiC(N,H) or multilayers thereof. The dielectric capping layer can be formed utilizing a deposition process such as, for example, CVD, PECVD, chemical solution deposition, evaporation, or ALD. The dielectric capping layer can have a thickness from 5 nm to 50 nm; although other thicknesses for the dielectric capping layer are possible and can be used in the present application. When present, the dielectric capping layer is 'opened' utilizing a same or different etch that is used in forming the openings into the second ILD material 54.

Figure 8A:
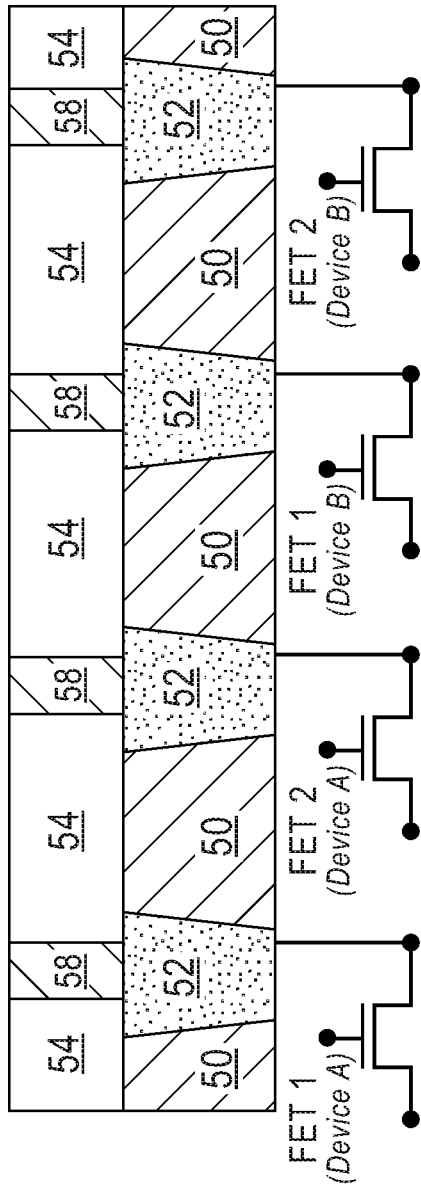
FIG. 8A is a cross sectional view of the structure shown in FIG. 7A (and along X-X shown in FIG. 5) after forming a bottom electrode in each of the plurality of openings present in the second ILD material.
Figure 8C:
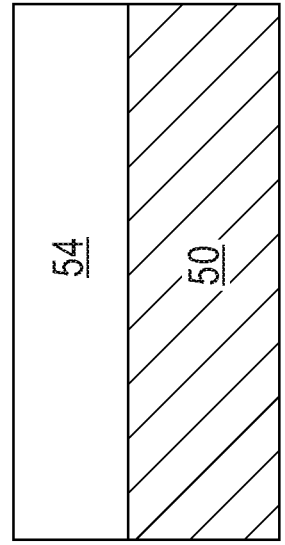
FIG. 8C is a cross sectional view of the structure shown in FIG. 8A, but along $Y_2$-$Y_2$ shown in FIG. 5.
Figure 8B:
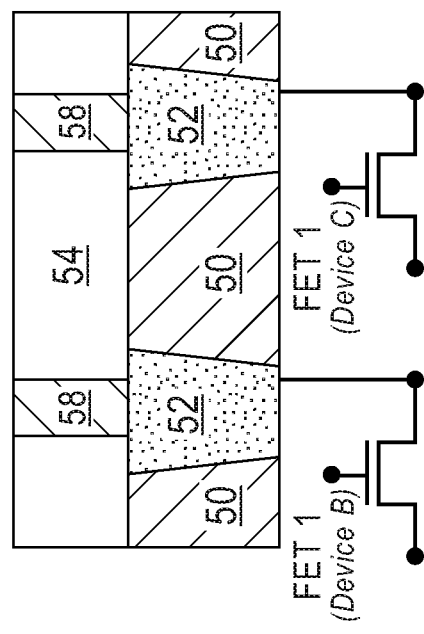
FIG. 8B is a cross sectional view of the structure shown in FIG. 8A, but along $Y_1$-$Y_1$ shown in FIG. 5.

Referring now to FIGS. 8A-8C, there are shown various cross sectional views of the initial structure shown in FIGS. 7A-7C after forming a bottom electrode 58 in each of the plurality of openings 56 present in the second ILD material 54. Each bottom electrode 58 that is formed into the second ILD material 54 has a critical dimension (CD) that is typically less than the CD of the underlying first electrically conductive structures 52. Each bottom electrode 58 has a topmost surface that is coplanar with a topmost surface of the second ILD material 56.

Each bottom electrode 58, which is present on a surface of one of the underlying first electrically conductive structures 52, can be composed of a conductive material such as, for example, Ta, TaN, Ti, TiN, Ru, RuN, RuTa, RuTaN, Co, CoWP, CoN, W, WN or any combination thereof. Each bottom electrode 58 can be formed by a deposition process such as, for example, sputtering, ALD, CVD, PECVD or PVD. A planarization process (such as, for example, chemical mechanical polishing) can follow the deposition of the conductive material that provides each bottom electrode 58.

Figure 9A:
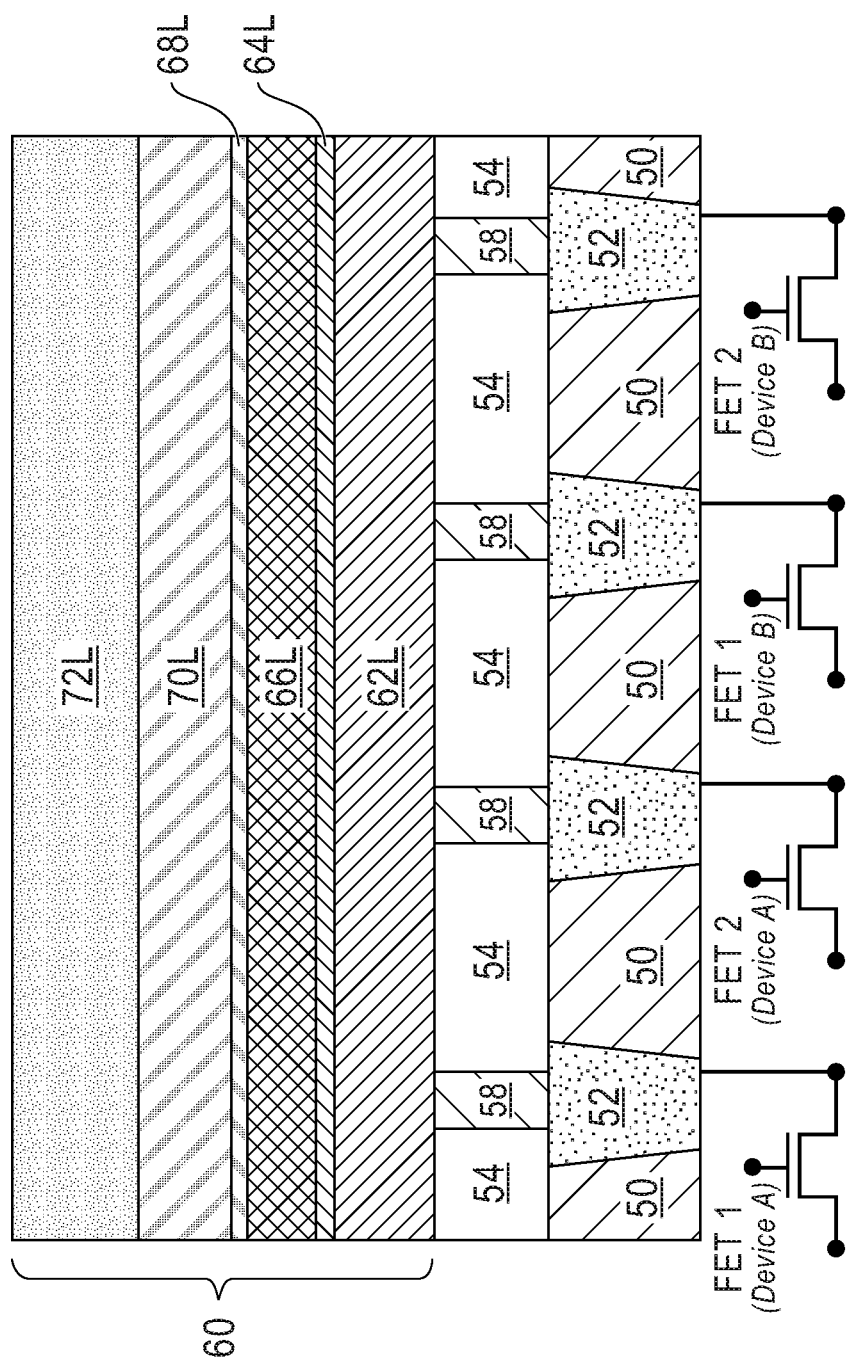
FIG. 9A is a cross sectional view of the structure shown in FIG. 8A (and along X-X shown in FIG. 5) after forming a MTJ-containing material stack above the second ILD material.
Figure 9C:
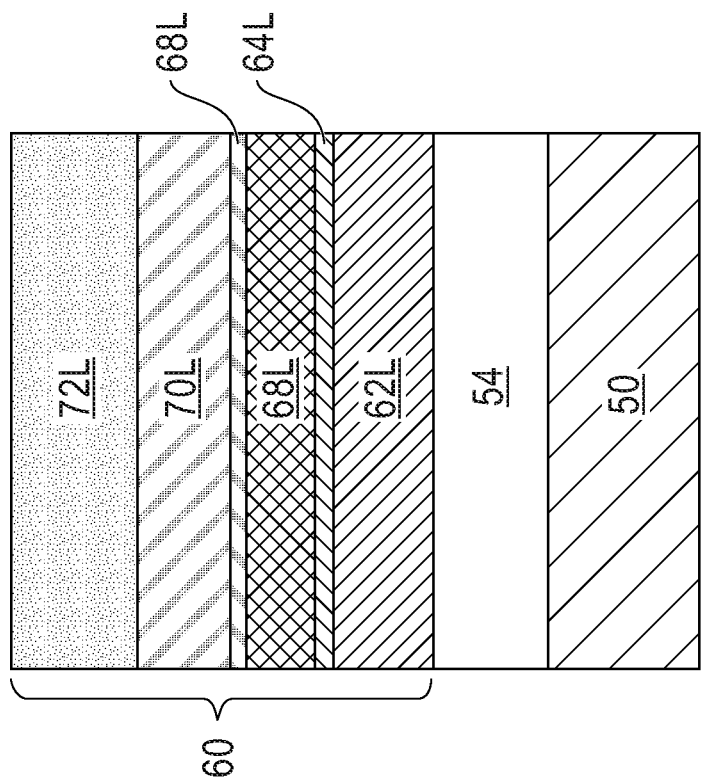
FIG. 9C is a cross sectional view of the structure shown in FIG. 9A, but along $Y_2$-$Y_2$ shown in FIG. 5.
Figure 9B:
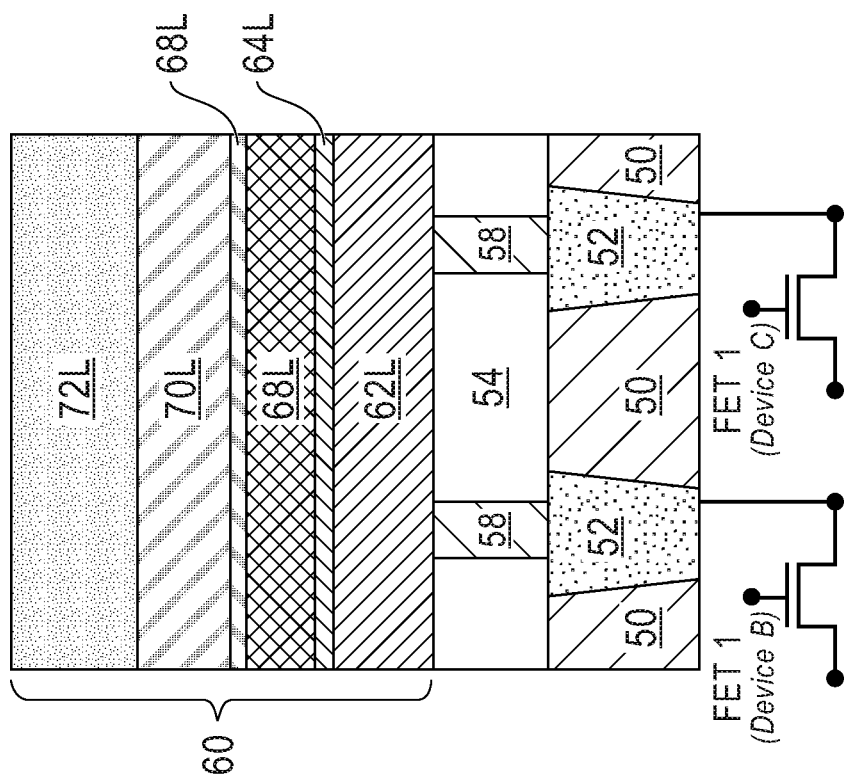
FIG. 9B is a cross sectional view of the structure shown in FIG. 9A, but along $Y_1$-$Y_1$ shown in FIG. 5.

Referring now to FIGS. 9A-9C, there are shown various cross sectional views of the initial structure shown in FIGS. 8A-8C after forming a MTJ-containing material stack 60 above the second ILD material 54. In some embodiments, and as is illustrated in FIGS. 9A-9C, the MTJ-containing material stack 60 is a top pinned MTJ-containing material stack that includes a low resistance metal layer 62L, a layer of current confinement material 64L, a layer of magnetic free material 66L, a layer of tunnel barrier material 68L, a layer of magnetic reference material 70L, and a metallic hard mask layer 72L; it is noted that the low resistance metal layer 62L will be used to provide a conductive write line 62 of the device, and the metallic hard mask layer 72L functions as a top electrode 72 of the device.

Other MTJ-containing material stack configurations are possible such as, for example, a bottom pinned MTJ-containing material stack (not shown) in which the magnetic reference layer 70L is located beneath the magnetic free layer 66L. In some embodiments (not shown), the layer of magnetic free material 66L includes a first layer of magnetic free material and a second layer of magnetic free material that are separated by a non-magnetic spacer.

The various material layers of the material stack 60 can be formed by utilizing one or more deposition processes such as, for example, plating, sputtering, plasma enhanced atomic layer deposition (PEALD), PECVD or PVD.

The low resistance metal layer 62L can include any metal that has a resistivity that is 1E-5 ohm·cm or less. Examples of metals that can be used as the low resistance metal layer 62L include, but are not limited to, tungsten (W), ruthenium (Ru), cobalt (Co), nickel (Ni), copper (Cu), aluminum (Al), platinum (Pt), silver (Ag) and gold (Au). As mentioned above, the low resistance metal layer 62L will provide a conductive write line 62 in the device of the present application. The low resistance metal layer 62L typically has a thickness from 20 nm to 80 nm; although other thicknesses for the low resistance metal layer 62L are possible and can be used as thickness of the low resistance metal layer 62L.

In some embodiments, the layer of current confinement material 64L can be composed of a diffusion barrier material such as, for example, Ti, TiN, Ta, and/or TaN. In embodiments in which the layer of current confinement material 64L is a diffusion barrier material, the layer of current confinement material 64L typically has a thickness from 1 nm to 100 nm. In other embodiments, the layer of current confinement material 64L can be composed of a metal oxide such as, for example, MgO, AlO, TiO and/or TaO. In embodiments in which layer of current confinement material 64L is composed of a metal oxide, the current confinement layer 64L can has a thickness of less than 2 nm. In yet other embodiments, the layer of current confinement material 64L can be omitted from the material stack 60.

The layer of magnetic free material 66L can be composed of a magnetic material (or a stack of magnetic materials) with a magnetization that can be changed in orientation relative to the magnetization orientation of the layer of magnetic reference material 70L. Exemplary magnetic materials for the layer of magnetic free material 66L include alloys and/or multilayers of cobalt, iron, alloys of cobalt-iron, nickel, alloys of nickel-iron, and alloys of cobalt-iron-boron.

If present, the non-magnetic metallic spacer layer is composed of a non-magnetic metal or metal alloy that allows magnetic information to be transferred therethrough and also permits the two layers of magnetic free materials to couple together magnetically, so that in equilibrium the first and second layers of magnetic free materials are always parallel. The non-magnetic metallic spacer layer allows for spin torque switching between the first and second layers of magnetic free materials. If present, the second layer of magnetic free material may include one of the magnetic materials mentioned above for layer of magnetic free material 66L. In one embodiment, the second layer of magnetic free material is composed of a same magnetic material as the layer of magnetic free material 66L. In another embodiment, the second layer of magnetic free material is composed of a magnetic material that is compositionally different from the layer of magnetic free material 66L.

The layer of tunnel barrier material 68L is composed of an insulator material and is formed at such a thickness as to provide an appropriate tunneling resistance. Exemplary materials for the layer of tunnel barrier material 68L include magnesium oxide, aluminum oxide, and titanium oxide, or materials of higher electrical tunnel conductance, such as semiconductors or low-bandgap insulators.

The layer of magnetic reference material 70L has a fixed magnetization. The layer of magnetic reference material 70L can be composed of a metal or metal alloy (or a stack thereof) that includes one or more metals. In alternative embodiments, exemplary metals for the formation of the layer of magnetic reference material 70L include iron, nickel, cobalt, chromium, boron, platinum, iridium or manganese. Exemplary metal alloys may include the metals exemplified by the above. In one embodiment, combinations of these materials and regions may also be employed.

The metallic hard mask layer 72L can be composed of one of the conductive materials mentioned above for the bottom electrode 58. In one embodiment, the conductive material that provides the metallic hard mask layer 72L is compositionally different from the bottom electrode 58. In another embodiment, the conductive material that provides the metallic hard mask layer 72L is compositionally the same as the bottom electrode 58.

Figure 10A:
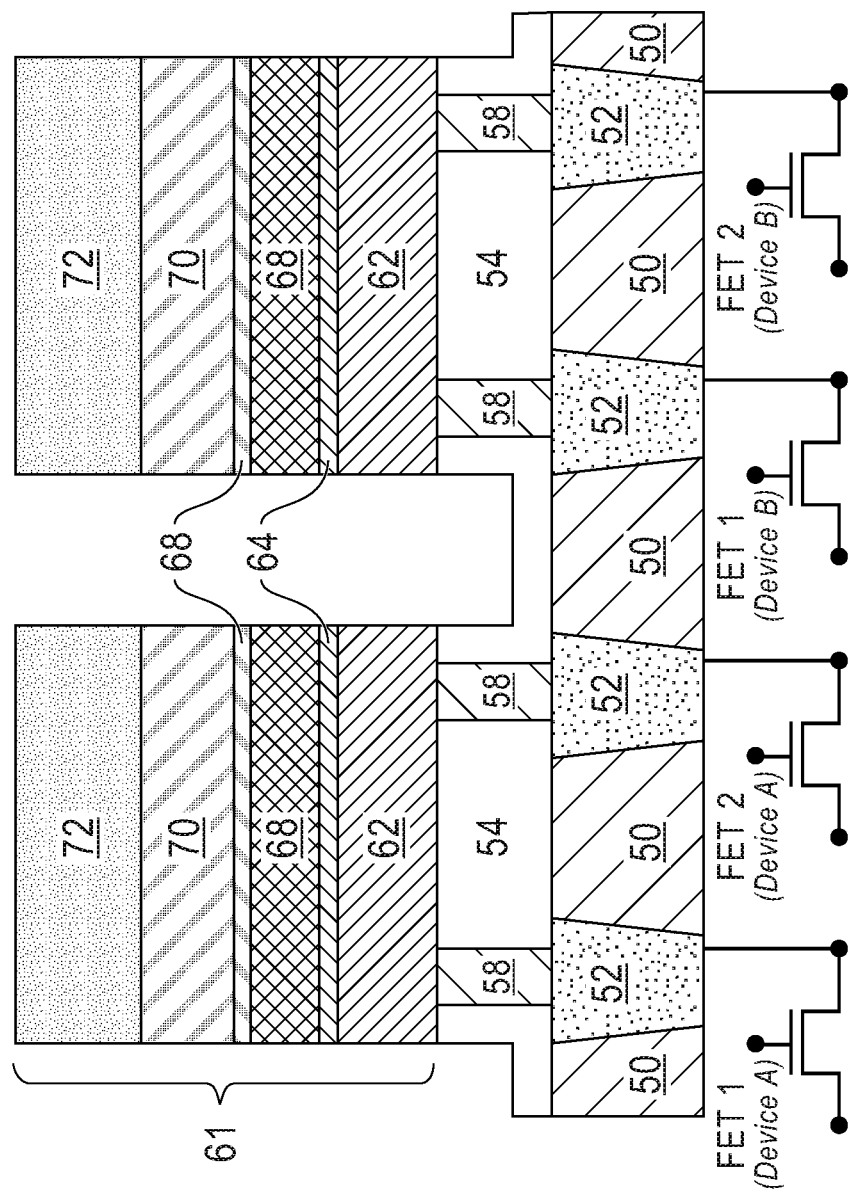
FIG. 10A is a cross sectional view of the structure shown in FIG. 9A (and along X-X shown in FIG. 5) after patterning the MTJ-containing material stack to provide MTJ-containing structures.
Figure 10C:
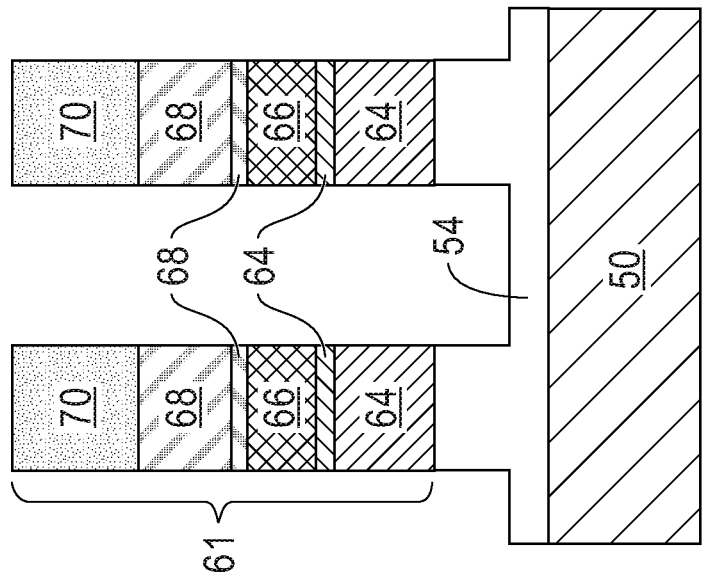
FIG. 10C is a cross sectional view of the structure shown in FIG. 10A, but along $Y_2$-$Y_2$ shown in FIG. 5.
Figure 10B:
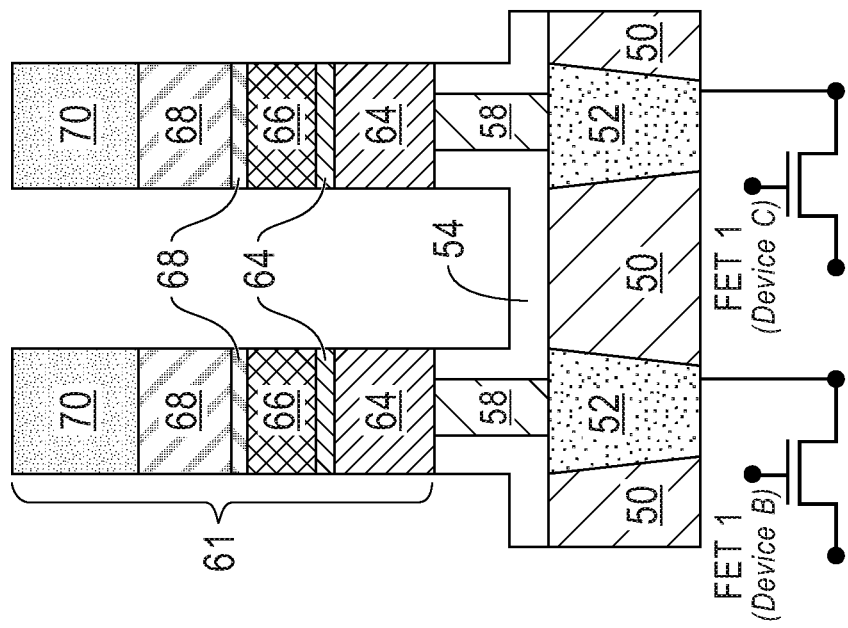
FIG. 10B is a cross sectional view of the structure shown in FIG. 10A, but along $Y_1$-$Y_1$ shown in FIG. 5.

Referring now to FIGS. 10A-10C, there are shown various cross sectional views of the initial structure shown in FIGS. 9A-9C after patterning the MTJ-containing material stack 60 to provide MTJ-containing structures 61. The number of MTJ-containing structures 61 is not limited to two as is shown in FIGS. 10A-10C of the present application; in some embodiments, a single MTJ-containing structure 61 can be formed, while in other embodiments two or more MTJ-containing structures 61 can be formed. The patterning of the MTJ-containing material stack 60 includes photolithography and etching. The etching can include ion beam etching (IBE). The MTJ-containing structures 61 are typically cylindrical in shape. However, other asymmetric shapes are possible and can be utilized in the present application as the shape of the MTJ-containing structures 61. Each MTJ-containing structure 61 contains a pair of underlying bottom electrodes 58.

Each MTJ-containing structure 61 includes a remaining, i.e., non etched portion, of the MTJ-containing material stack 60. In the illustrated embodiment of the present application, each MTJ-containing structure 61 includes remaining portions of the low resistance metal layer 62L (hereinafter "conductive write line 62"), the layer of current confinement material 64L (hereinafter "current confinement layer 64"), the layer of magnetic free material 66L (hereinafter "magnetic free layer 66"), the layer of tunnel barrier material 68L (hereinafter "tunnel barrier layer 68"), the layer of magnetic reference material 70L (hereinafter "magnetic reference layer 70"), and the metallic hard mask layer 72L (hereinafter "top electrode 72"). Each MTJ-containing structure 61 includes a MTJ pillar composed of the magnetic free layer 66, the tunnel barrier layer 68, and the magnetic reference layer 70, and a top electrode 72. The magnetic free layer 66 of the MTJ pillar is in close proximity (as defined above) to the conductive write line 62; in the illustrated embodiment, the magnetic free layer 66 of the MTJ pillar is separated from the conductive write line 62 by the thickness of the current confinement layer 64.

In the present application, magnetic domain devices are contemplated including, for example, one in which the magnetic free layer 66 of the MTJ pillar forms a direct interface with the conductive write line 62, or one in which the magnetic free layer 66 of the MTJ pillar is separated from the conductive write line 62 by the thickness, or combined thickness, of one or more material layers. The one or more material layers can include both the tunnel barrier layer and the magnetic reference layer of a bottom pinned MTJ stack, a current confinement layer, a conductive via structure or any combination thereof.

Each element of the MTJ-containing structures 61 has an outermost sidewall that is typically vertically aligned to an outermost sidewall of the other elements in the MTJ-containing structures 61. Each MTJ-containing structure 61 has a CD that is larger than the CD of each of the bottom electrodes 58.

In some embodiments of the present application, and during the etching of the MTJ-containing material stack 60, a portion of the second ILD material 54 can be etched as well. In such an embodiment, the second ILD material 54 that is located beneath each MTJ-containing structure 61 has a topmost surface that is coplanar with a topmost surface of the bottom electrodes 58, and the second ILD material 54 that has been etched has a recessed surface that is vertically offset and located below the topmost surface of the second ILD material 54 that is located beneath each MTJ-containing structure 61. No portion of any of the bottom electrodes 58 is physically exposed by this etch.

Figure 11A:
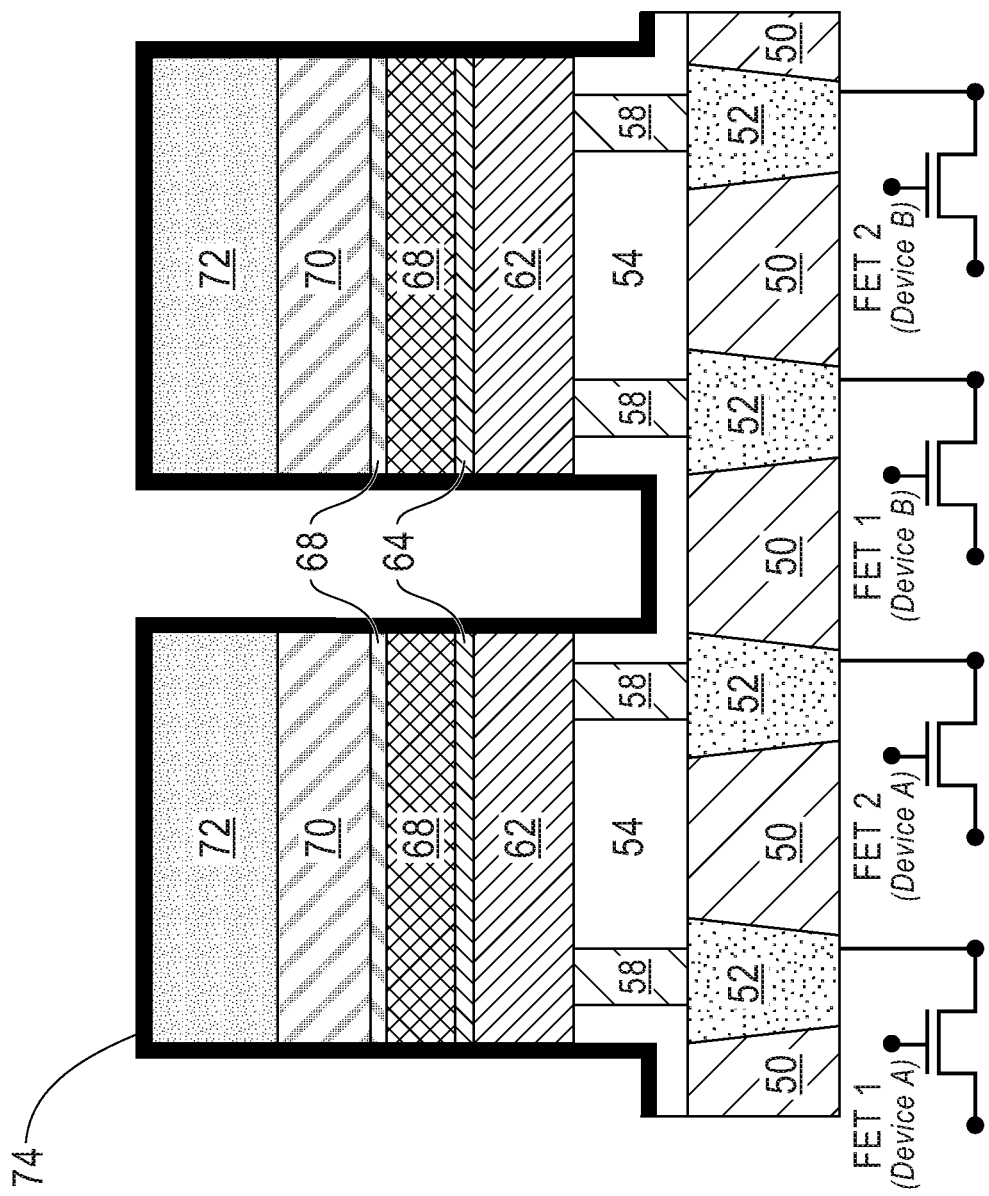
FIG. 11A is a cross sectional view of the structure shown in FIG. 10A (and along X-X shown in FIG. 5) after forming a dielectric liner on the MTJ-containing structures.
Figure 11C:
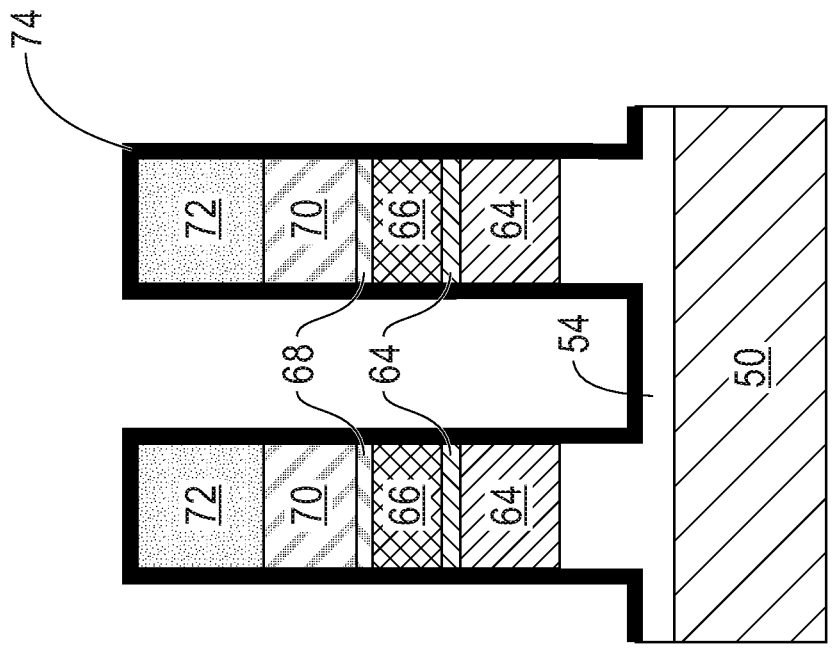
FIG. 11C is a cross sectional view of the structure shown in FIG. 11A, but along $Y_2$-$Y_2$ shown in FIG. 5.
Figure 11B:
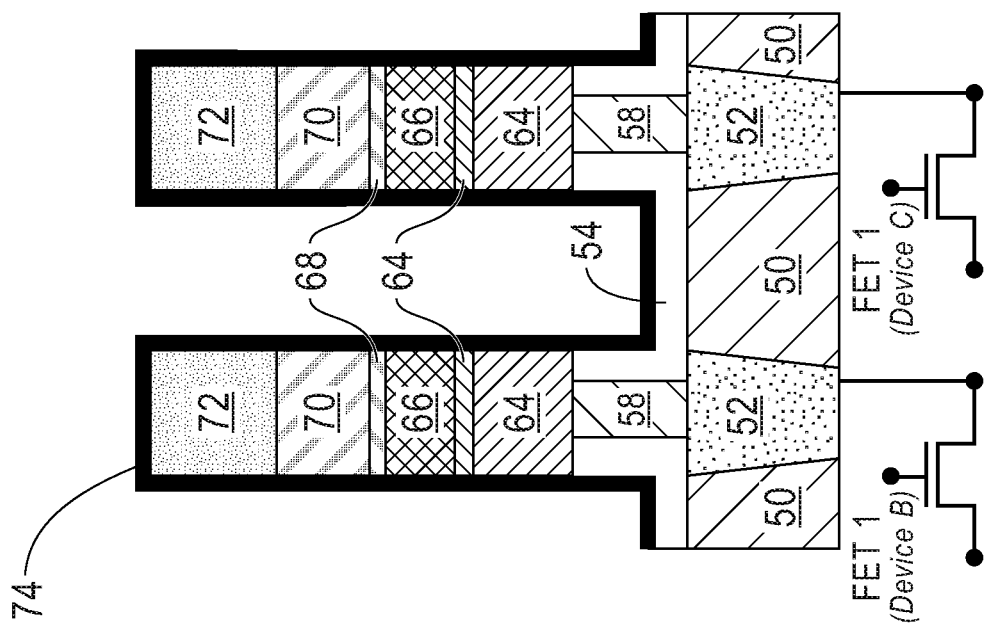
FIG. 11B is a cross sectional view of the structure shown in FIG. 11A, but along $Y_1$-$Y_1$ shown in FIG. 5.

Referring now to FIGS. 11A-11C, there are shown various cross sectional views of the initial structure shown in FIGS. 10A-10C after forming a dielectric liner 74 on the MTJ-containing structures 61. As is shown, the dielectric liner 74 is located on a sidewall and a topmost surface of the MTJ structure 61. The dielectric liner 74 also extends onto a physically exposed surface of the second ILD material 54.

The dielectric liner 74 is composed of a dielectric material, which in some embodiments can provide passivation (to air and/or moisture) to each MTJ structure 61. In one example, the dielectric liner 74 is composed of silicon nitride. In another example, the dielectric liner 74 is composed of a dielectric material that contains atoms of silicon, carbon and hydrogen. In some embodiments, and in addition to atoms of carbon and hydrogen, the dielectric material that provides the dielectric liner 74 can include atoms of at least one of nitrogen and oxygen. In other embodiments, and in addition to atoms of silicon, nitrogen, carbon and hydrogen, the dielectric material that provides the dielectric liner 74 can include atoms of boron. In one example, the dielectric liner 74 can be composed of an nBLOK dielectric material that contains atoms of silicon, carbon, hydrogen, nitrogen and oxygen. In alternative example, the dielectric liner 74 can be composed of a SiBCN dielectric material that contains atoms of silicon, boron, carbon, hydrogen, and nitrogen.

The dielectric liner 74 can be formed utilizing a deposition process such as, for example, PECVD, PVD, or PEALD. The dielectric liner 74 may have a thickness from 10 nm to 200 nm. Other thicknesses are possible and can be employed as the thickness of the dielectric liner 74. In some embodiments, the dielectric liner 74 has a conformal thickness. The term "conformal" denotes that a material layer has a vertical thickness along horizontal surfaces that is substantially the same (i.e., within ±5%) as the lateral thickness along vertical surfaces.

Figure 12A:
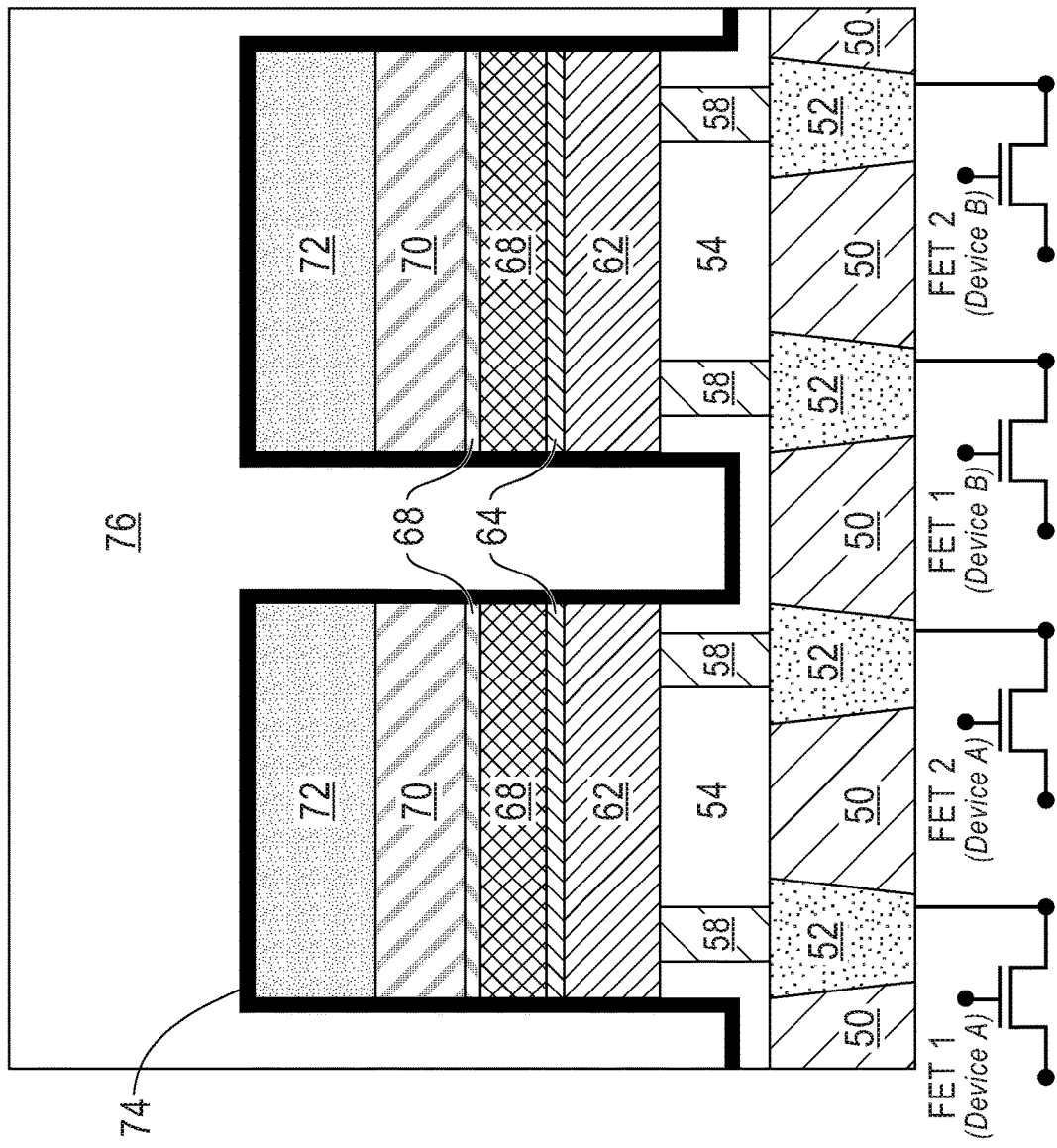
FIG. 12A is a cross sectional view of the structure shown in FIG. 11A (and along X-X shown in FIG. 5) after forming a third ILD material laterally surrounding and above each of the MTJ-containing structures.
Figure 12C:
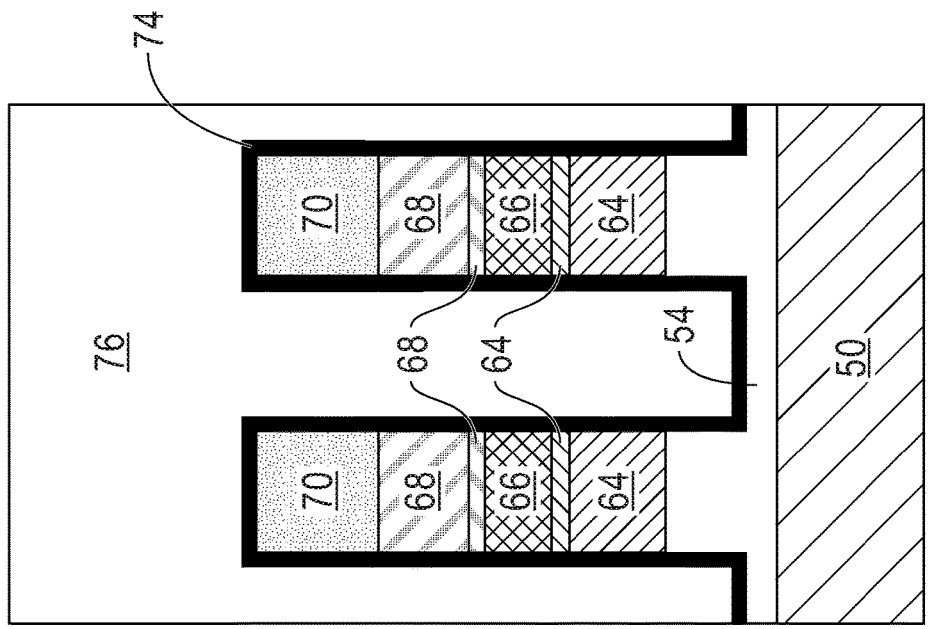
FIG. 12C is a cross sectional view of the structure shown in FIG. 12A, but along $Y_2$-$Y_2$ shown in FIG. 5.
Figure 12B:
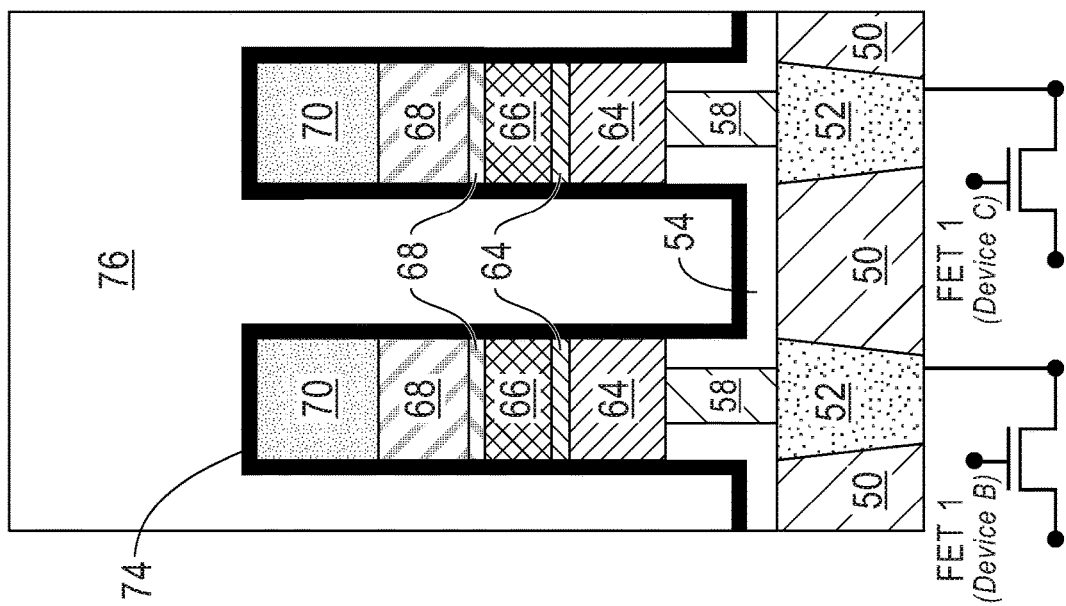
FIG. 12B is a cross sectional view of the structure shown in FIG. 12A, but along $Y_1$-$Y_1$ shown in FIG. 5.

Referring now to FIGS. 12A-12C, there are shown various cross sectional views of the initial structure shown in FIGS. 11A-11C after forming a third ILD material 76 laterally surrounding and above each of the MTJ-containing structures 61.

The third ILD material 76 can include one of the dielectric materials mentioned above for the first ILD material 50. In some embodiments of the present application, the third ILD material 76 is composed of a dielectric material that is compositionally the same as the dielectric material that provides the first ILD material 50 and/or the second ILD material 54. In yet other embodiments, the third ILD material 76 is composed of a dielectric material that is compositionally different than the dielectric material that provides the first ILD material 50 and/or the second ILD material 54. The third ILD material 76 can be formed utilizing one of the deposition processes mentioned above in forming the first ILD material 50.

Figure 13A:
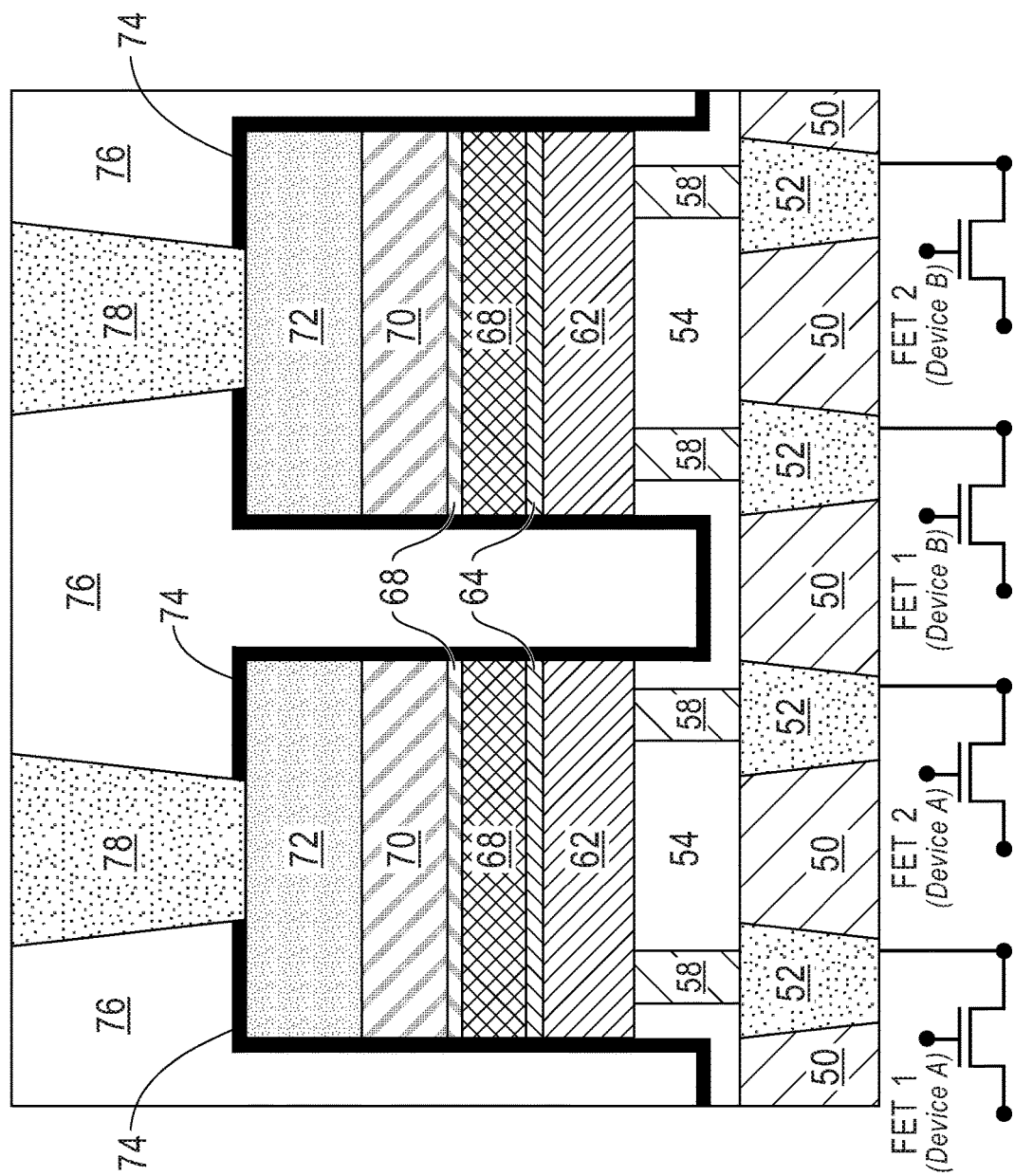
FIG. 13A is a cross sectional view of the structure shown in FIG. 12A (and along X-X shown in FIG. 5) after forming second electrically conductive structures in the third ILD material, wherein each second electrically conductive structure directly contacts a surface of an underlying MTJ-containing structure.
Figure 13C:
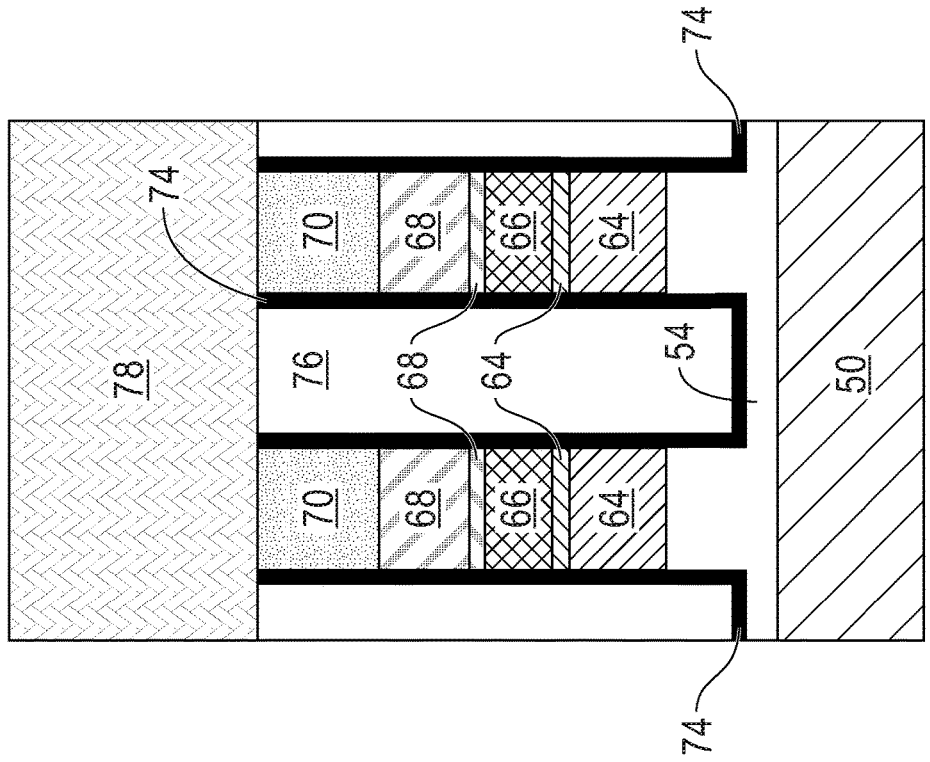
FIG. 13C is a cross sectional view of the structure shown in FIG. 13A, but along $Y_2$-$Y_2$ shown in FIG. 5.
Figure 13B:
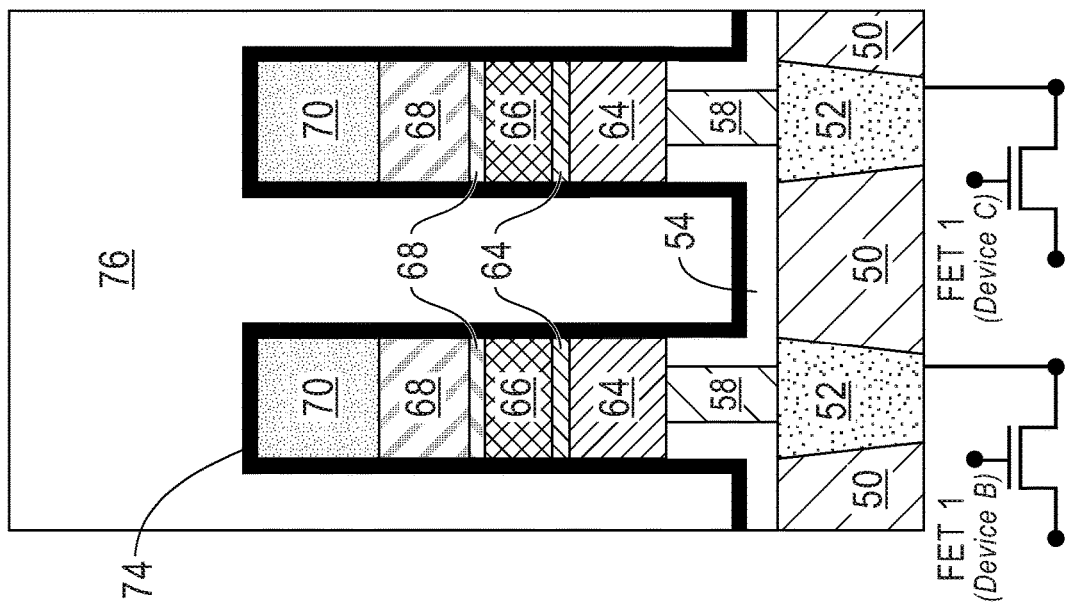
FIG. 13B is a cross sectional view of the structure shown in FIG. 13A, but along $Y_1$-$Y_1$ shown in FIG. 5.

Referring now to FIGS. 13A-13C, there are shown various cross sectional views of the initial structure shown in FIGS. 12A-12C after forming second electrically conductive structures 78 in the third ILD material 76, wherein each second electrically conductive structure 78 directly contacts a surface of an underlying MTJ-containing structure 61.

The second electrically conductive structures 78 can be formed by first forming openings (not specifically shown) into the third ILD material 76 and the dielectric liner 74. The openings can be formed by lithography and etching. After forming the openings into the third dielectric material 76, second electrically conductive structures 78 are formed by deposition of an electrically conductive metal or electrically conductive metal alloy followed by an optional planarization process.

The electrically conductive metal or electrically conductive metal alloy that provides each second electrically conductive structure 78 can include one of the electrically conductive metals or electrically conductive metal alloys mentioned above for the first electrically conductive structures 52. In some embodiments, the second electrically conductive structures 78 are composed of a compositionally same electrically conductive material as the first electrically conductive structures 52. In other embodiments, the second electrically conductive structures 78 are composed of a compositionally different electrically conductive material than the first electrically conductive structures 52. The electrically conductive metal or electrically conducive metal alloy layer that provides each second electrically conductive structure 78 can be formed utilizing one of the deposition processing mentioned above for forming the electrically conductive metal or electrically conducive metal alloy layer that provides each first electrically conductive structure 52. Each second electrically conductive structure 78 has a topmost surface that is coplanar with a topmost surface of the third ILD material 76.

In some embodiments, a diffusion barrier liner is formed along the sidewalls and a bottom wall of each of the second electrically conductive structures 78. In some embodiments, no diffusion barrier liner is present. The diffusion barrier liner is composed of a diffusion barrier material (i.e., a material that serves as a barrier to prevent a conductive material such as copper from diffusing there through) as defined above. The diffusion barrier material layer can be formed by a deposition process including, for example, CVD, PECVD, atomic layer deposition (ALD), physical vapor deposition (PVD), sputtering, chemical solution deposition or plating. When present, the diffusion barrier liner has a topmost surface that is coplanar with a topmost surface of the second electrically conductive structures 78 and a topmost surface of the third ILD material 76.

It is noted that the FIGS. 6A-13C illustrate a method that can be used in providing the device shown in FIG. 2B. The method illustrated in FIGS. 6A-13C can be modified used processing techniques well known in the art to form the other type of devices shown in FIGS. 2B, 2C and 2D.

While the present application has been particularly shown and described with respect to preferred embodiments thereof, it will be understood by those skilled in the art that the foregoing and other changes in forms and details may be made without departing from the spirit and scope of the present application. It is therefore intended that the present application not be limited to the exact forms and details described and illustrated, but fall within the scope of the appended claims.

What is claimed is:

1. A magnetic domain device comprising:
a magnetic tunnel junction (MTJ) pillar located on a conductive write line, the MTJ pillar comprising a magnetic free layer, a tunnel barrier layer, and a magnetic reference layer, wherein the magnetic free layer of the MTJ pillar is spaced apart from conductive write line by a thickness of at least one or more material layers comprising a current confinement layer, a conductive via structure, or a combination of a current confinement layer and a conductive via structure.

2. The magnetic domain device of claim 1, wherein the MTJ pillar is a top pinned MTJ pillar comprising, from bottom to top, the magnetic free layer, the tunnel barrier layer, and the magnetic reference layer.

3. The magnetic domain device of claim 1, wherein the MTJ pillar is a bottom pinned MTJ pillar comprising, from bottom to top, the magnetic reference layer, the tunnel barrier layer, and the magnetic free layer.

4. The magnetic domain device of claim 3, wherein the magnetic free layer of the MTJ pillar is further spaced apart from the conductive write line by a combined thickness of at least the magnetic reference layer and the tunnel barrier layer.

5. The magnetic domain device of claim 1, further comprising a pair of spaced apart bottom electrodes located beneath, and in contact with, the conductive write line.

6. The magnetic domain device of claim 5, wherein each bottom electrode of the pair of spaced apart bottom electrodes is located on a surface of a first electrically conductive structure.

7. The magnetic domain device of claim 6, wherein each first electrically conductive structure is connected to an access device.

8. The magnetic domain device of claim 5, further comprising a top electrode located on the MTJ pillar.

9. The magnetic domain device of claim 8, wherein the top electrode has an outermost sidewall that is vertically aligned to an outermost sidewall of each of the MTJ pillar, and the conductive write layer.

10. The magnetic domain device of claim 8, further comprising a dielectric liner located on a topmost surface of top electrode, and along an outermost sidewall of each of the top electrode, the MTJ pillar, and the conductive write layer.

11. The magnetic domain device of claim 8, further comprising an electrically conductive structure contacting a portion of the topmost surface of the top electrode.

12. A magnetic domain device comprising:
a magnetic tunnel junction (MTJ) pillar comprising a magnetic free layer and located on a conductive write line, wherein the magnetic free layer is located in close proximity to the conductive write line;
a pair of spaced apart bottom electrodes located beneath, and in contact with, the conductive write line, wherein each bottom electrode of the pair of spaced apart bottom electrodes is located on a surface of a first electrically conductive structure, and each first electrically conductive structure is connected to an access device; and
a top electrode located on the MTJ pillar, wherein the top electrode has an outermost sidewall that is vertically aligned to an outermost sidewall of each of the MTJ pillar, and the conductive write layer.

13. A method of programming of a magnetic domain device, the method comprising
providing a magnetic domain device comprising a magnetic tunnel junction (MTJ) pillar located on a conductive write line; and
passing a current through the conductive write line, wherein the current in the conductive write line generates a magnetic field that nucleates magnetic domains in a magnetic free layer of the MTJ pillar, wherein the MTJ pillar further comprises a tunnel barrier layer, and a magnetic reference layer, wherein the tunnel barrier layer is located between the magnetic free layer and the magnetic reference layer and the conductive write line is spaced apart from the magnetic free layer by a distance of from 1 nm to 100 nm.

14. A method of reading a resistance state of a magnetic domain device, the method comprising:

providing a magnetic domain device comprising a magnetic tunnel junction (MTJ) pillar located on a conductive write line, wherein a pair of spaced apart bottom electrodes is located beneath the conductive write line and a top electrode is located on the MTJ pillar;

applying a read voltage to at least one of the bottom electrodes and the top electrode; and measuring the device resistance provided by the read voltage, wherein the device resistance is proportional to the area of magnetic domains aligned along/against the magnetization of a magnetic reference layer of the MTJ pillar.

* * * * *